(12) United States Patent
Appelt et al.

(10) Patent No.: US 11,574,856 B2
(45) Date of Patent: Feb. 7, 2023

(54) SEMICONDUCTOR PACKAGE

(71) Applicant: Advanced Semiconductor Engineering, Inc., Kaohsiung (TW)

(72) Inventors: Bernd Karl Appelt, Holly Springs, NC (US); You-Lung Yen, Kaohsiung (TW); Kay Stefan Essig, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 39 days.

(21) Appl. No.: 17/221,597

(22) Filed: Apr. 2, 2021

(65) Prior Publication Data

US 2021/0225746 A1    Jul. 22, 2021

Related U.S. Application Data

(63) Continuation of application No. 15/986,636, filed on May 22, 2018, now abandoned.

(51) Int. Cl.
*H01L 23/49* (2006.01)
*H01L 23/498* (2006.01)
(Continued)

(52) U.S. Cl.
CPC ...... *H01L 23/49805* (2013.01); *H01L 21/481* (2013.01); *H01L 21/486* (2013.01);
(Continued)

(58) Field of Classification Search
CPC ............. H01L 23/49805; H01L 21/481; H01L 21/4857; H01L 21/486; H01L 21/561;
(Continued)

(56) References Cited

U.S. PATENT DOCUMENTS

| 5,471,368 A | 11/1995 | Downie et al. |
| 5,729,437 A | 3/1998 | Hashimoto |

(Continued)

FOREIGN PATENT DOCUMENTS

| CN | 102064141 A | 5/2011 |
| JP | 2001-223286 A | 8/2001 |

(Continued)

OTHER PUBLICATIONS

Final Office Action for U.S. Appl. No. 15/986,636, dated Dec. 2, 2020, 12 pages.

(Continued)

*Primary Examiner* — Shouxiang Hu
(74) *Attorney, Agent, or Firm* — Foley & Lardner LLP

(57) ABSTRACT

A semiconductor package includes a base material, a capture land, an interconnection structure, a semiconductor chip and an encapsulant. The base material has a top surface and an inner lateral surface. The capture land is disposed in or on the base material, and has an outer side surface. The interconnection structure is disposed along the inner lateral surface of the base material, and on the capture land. The interconnection structure has an outer side surface. An outer side surface of the semiconductor package includes the outer side surface of the capture land and the outer side surface of the interconnection structure. The semiconductor chip is disposed on the top surface of the base material. The encapsulant is disposed adjacent to the top surface of the base material, and covers the semiconductor chip.

20 Claims, 35 Drawing Sheets

(51) Int. Cl.
*H01L 21/48* (2006.01)
*H01L 21/56* (2006.01)
*H01L 23/00* (2006.01)
*H01L 23/31* (2006.01)

(52) U.S. Cl.
CPC ........ *H01L 21/4857* (2013.01); *H01L 21/561* (2013.01); *H01L 23/49822* (2013.01); *H01L 23/49838* (2013.01); *H01L 24/16* (2013.01); H01L 23/3121 (2013.01); H01L 2224/16227 (2013.01); H01L 2224/16235 (2013.01); *H01L 2924/19105* (2013.01)

(58) Field of Classification Search
CPC ......... H01L 23/49822; H01L 23/49838; H01L 24/16; H01L 23/3121; H01L 2224/16227; H01L 2224/16235; H01L 2924/19105; H01L 24/97; H01L 2224/16237; H01L 2224/97; H01L 2924/15159; H01L 21/6835; H01L 23/13; H01L 2221/68345; H01L 2924/15313; H01L 21/4853; H01L 21/76895; H01L 23/49816; H01L 23/5386
See application file for complete search history.

(56) References Cited

U.S. PATENT DOCUMENTS

| | | | |
|---|---|---|---|
| 6,383,835 B1* | 5/2002 | Hata | ..................... H01L 25/167 |
| | | | 257/E25.032 |
| 6,872,599 B1 | 3/2005 | Li et al. | |
| 8,212,339 B2 | 7/2012 | Liao et al. | |
| 10,045,436 B2 | 8/2018 | Cho et al. | |
| 2001/0042640 A1 | 11/2001 | Nakamura et al. | |
| 2003/0173664 A1 | 9/2003 | Ohuchi et al. | |
| 2004/0232549 A1* | 11/2004 | Saito | ..................... H01L 21/561 |
| | | | 257/E21.705 |
| 2005/0207697 A1* | 9/2005 | Kek | ..................... H01L 25/167 |
| | | | 257/E25.032 |
| 2007/0077747 A1 | 4/2007 | Heck et al. | |
| 2015/0129293 A1 | 5/2015 | Cho et al. | |
| 2016/0353572 A1 | 12/2016 | Lim et al. | |
| 2018/0012872 A1 | 1/2018 | Okui et al. | |

FOREIGN PATENT DOCUMENTS

| | | |
|---|---|---|
| JP | 4822484 B2 | 1/2003 |
| JP | 2005-166931 A | 6/2005 |
| JP | 2008-166634 A | 7/2008 |

OTHER PUBLICATIONS

Final Office Action for U.S. Appl. No. 15/986,636, dated Jan. 8, 2020, 7 pages.
Non-Final Office Action for U.S. Appl. No. 15/986,636, dated Jun. 1, 2020, 10 pages.
Non-Final Office Action for U.S. Appl. No. 15/986,636, dated Sep. 5, 2019, 9 pages.
Office Action from corresponding Chinese Patent Application No. 201910413151.2, dated Aug. 21, 2020, 15 pages.
Search Report with English Translation from corresponding Chinese Patent Application No. 201910413151.2, dated Aug. 21, 2020, 4 pages.

* cited by examiner

SEMICONDUCTOR PACKAGE

CROSS-REFERENCE TO RELATED APPLICATION

This application is a continuation of U.S. patent application Ser. No. 15/986,636 filed May 22, 2018, the contents of which is incorporated herein by reference in its entirety.

BACKGROUND

1. Field of the Disclosure

The present disclosure relates to a semiconductor package and a manufacturing method, and to a semiconductor package including a substrate having a capture land and a method for manufacturing the substrate and the semiconductor package.

2. Description of the Related Art

Castellated packages have been used in the auto-vehicle (ATV) field. The castellated packages historically have castellated side surfaces based on sawn copper (Cu) plated through holes (PTHs). During assembly to the motherboard, solder wicks up the sidewalls of the PTHs and forms a solder fillet which can be inspected for joint quality. That is, the side surfaces of the castellated package are solder wettable flanks that can be used for inspection to insure the joint quality between the castellated packages and the motherboard. However, the castellated packages are typically not over molded because the molding compound would penetrate the PTHs and prevent the solder from wetting onto the sidewalls of the PTHs. In addition, during a saw singulation process of the castellated packages, the Cu layer on the sidewall of the PTH may be ripped from the substrate base (e.g., an interposer). This results in defective castellation PTHs in the opposing singulated packages. That is, extra Cu pieces remain on the sidewall of one PTH-half of a castellated package, and Cu-voids form on the sidewall of the opposing PTH-halves of the opposing castellated package.

SUMMARY

In some embodiments, a semiconductor package includes a base material, a capture land, an interconnection structure, a semiconductor chip and an encapsulant. The base material has a top surface and an inner lateral surface. The capture land is disposed in or on the base material, and has an outer side surface. The interconnection structure is disposed along the inner lateral surface of the base material, and on the capture land. The interconnection structure has an outer side surface. An outer side surface of the semiconductor package includes the outer side surface of the capture land and the outer side surface of the interconnection structure. The semiconductor chip is disposed on the top surface of the base material. The encapsulant is disposed adjacent to the top surface of the base material, and covers the semiconductor chip.

In some embodiments, a semiconductor package includes a substrate, a semiconductor chip and an encapsulant. The substrate includes a base material, an indentation structure, a capture land and an interconnection structure. The base material has a top surface and an outer side surface connected to the top surface. The indentation structure is recessed from the outer side surface of the base material, and has a first width. The capture land is disposed in or on the base material and is disposed adjacent to the indentation structure. The capture land has a third width that is greater than the first width of the indentation structure. The interconnection structure is disposed in the indentation structure and connected to the capture land. The semiconductor chip is disposed adjacent to the top surface of the base material. The encapsulant covers the semiconductor chip and the substrate.

In some embodiments, a manufacturing process includes: (a) providing a substrate, wherein the substrate includes a base material and a capture land disposed in or on the base material, and the capture land extends across a singulation line of the substrate; and (b) forming a recess structure at the singulation line, wherein a position of the recess structure corresponds to a position of the capture land.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
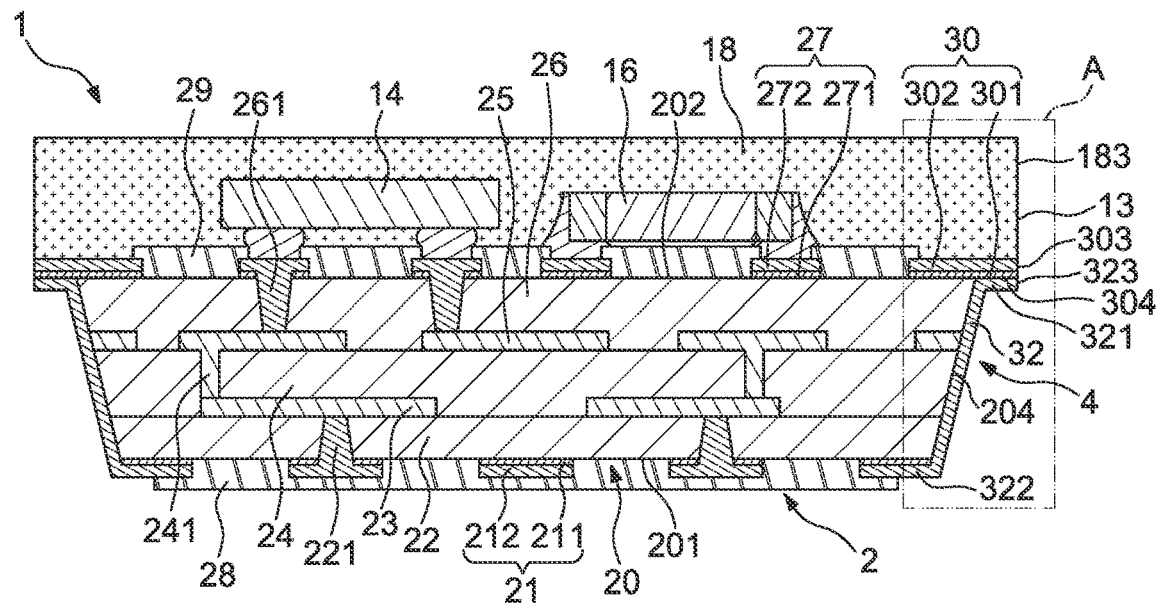
FIG. 1 illustrates a cross-sectional view of a semiconductor package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a semiconductor package including a substrate having a capture land and an interconnection structure, wherein an outer side surface of the semiconductor package includes the outer side surface of the capture land and the outer side surface of the interconnection structure. At least some embodiments of the present disclosure provide for techniques for manufacturing the substrate and the semiconductor package.

In a comparative castellated package, a plurality of package units are mounted to a substrate base (e.g., an interposer) individually. Since each of the package units may represent different assembly process so that the manufacturing process is complicated. Besides, each comparative castellated package may include the substrate base (e.g., the interposer) on which the package unit is mounted to, so that the substrate base (e.g., the interposer) is another additional cost. Further, another issue is that the comparative castellated package are typically not over molded because the molding compound would penetrate the PTHs and prevent the solder from wetting onto the sidewalls of the PTHs. Thus, when the comparative castellated package is attached to the motherboard by using, for example, surface mounting technique (SMT), the yield rate and the soldering reliability of the surface mounting technique (SMT) are low.

The present disclosure provides for a semiconductor package including a substrate having a capture land and an interconnection structure to address at least the above concerns. In some embodiments, the capture land is disposed to cover a hole of the substrate. The interconnection structure may be formed on the sidewall of the hole, and then be cut. The capture land can prevent the molding compound from entering the hole.

Figure 2:
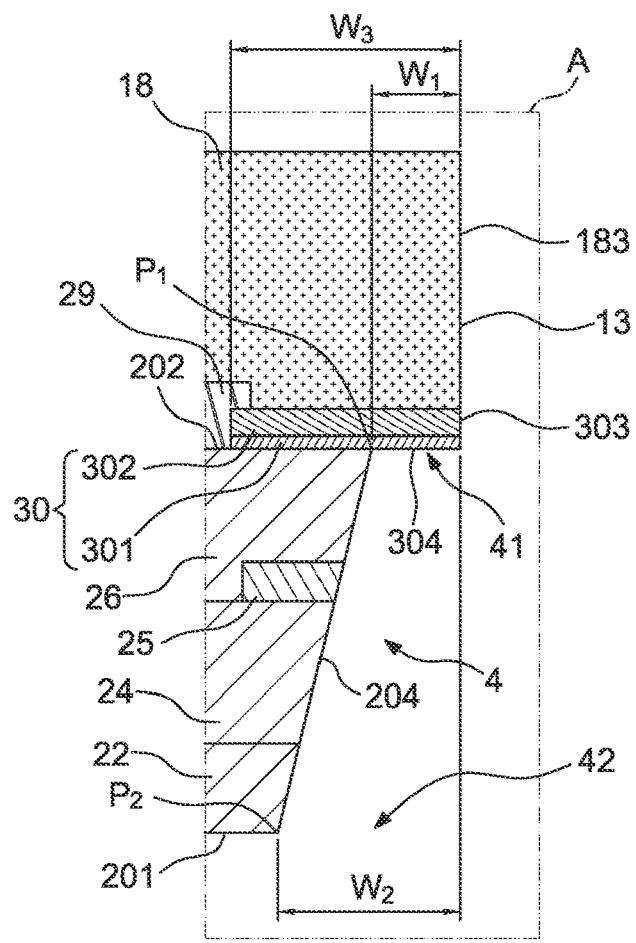
FIG. 2 illustrates an enlarged view of an area "A" shown in FIG. 1, wherein an interconnection structure is omitted for the purpose of the clear explanation.

FIG. 1 illustrates a cross-sectional view of a semiconductor package 1 according to some embodiments of the present disclosure. FIG. 2 illustrates an enlarged view of an area "A" shown in FIG. 1, wherein an interconnection structure is omitted for the purpose of the clear explanation. The semiconductor package 1 includes a substrate 2, at least one semiconductor chip 14, at least one passive device 16 and an encapsulant 18.

The substrate 2 may be a package substrate or an interposer used for carrying the semiconductor chip 14 and the passive device 16, and may include a base material 20, a capture land 30, an interconnection structure 32, an indentation structure 4, a first protection layer 28 and a second protection layer 29. The base material 20 has a bottom surface 201, a top surface 202, an outer side surface 203 (FIG. 3) and an inner lateral surface 204. The top surface 202 is opposite to the bottom surface 201. The outer side surface 203 extends between the bottom surface 201 and the top surface 202, that is, the outer side surface 203 may be connected to the top surface 202 and/or the bottom surface 201. The inner lateral surface 204 is recessed form the outer side surface 203. As shown in FIG. 1, the inner lateral surface 204 extends between the bottom surface 201 and the top surface 202, that is, the inner lateral surface 204 is a curved surface formed from a through hole extending through the base material 20, and is connected to the top surface 202 and the bottom surface 201. However, in another embodiment, the inner lateral surface 204 may be formed from a blind hole that does not extend through the base material 20, and may be connected to the bottom surface 201. That is, the inner lateral surface 204 may not be connected to the top surface 202. In some embodiments, the inner lateral surface 204 of the base material 20 is inclined with respect to the top surface 202 of the base material 20. That is, the inner lateral surface 204 is not perpendicular to the top surface 202 and the bottom surface 201 of the base material 20. As shown in FIG. 1, an inclination angle between the inner lateral surface 204 and the top surface 202 of the base material 20 is less than 90 degrees, and an inclination angle between the inner lateral surface 204 and the bottom surface 201 of the base material 20 is greater than 90 degrees.

The base material 20 includes a first circuitry structure 21, a first dielectric structure 22, a first via structure 221, a second circuitry structure 23, a second dielectric structure 24, a second via structure 241, a third circuitry structure 25, a third dielectric structure 26, a third via structure 261 and a fourth circuitry structure 27. Each of the first dielectric structure 22, the second dielectric structure 24 and the third dielectric structure 26 may be a dielectric layer or a passivation layer and may include, or be formed from, a photoresist layer, a cured photosensitive material, a cured photo-imageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof. In one or more embodiments, each of the first dielectric structure 22, the second dielectric structure 24 and the third dielectric structure 26 may include, or be formed from a dry film type material that includes a resin and a plurality of fillers. In another embodiment, each of the first dielectric structure 22, the second dielectric structure 24 and the third dielectric structure 26 may include, or be formed from a liquid type material that includes a homogeneous resin without fillers. In some embodiments, the material of each of the first dielectric structure 22, the second dielectric structure 24 and the third dielectric structure 26 may include inorganic material (e.g., $SiO_x$, $SiN_x$, $TaO_x$), a glass, glass fabric, glass fibers, silicon, or a ceramic.

The first circuitry structure 21 may be a patterned circuit layer. As shown in FIG. 1, the first circuitry structure 21 may be a redistribution layer (RDL), and is disposed on the bottom surface of the first dielectric structure 22 (e.g., the bottom surface 201 of the base material 20). For example, the first circuitry structure 21 may include a first metal layer 211 and a second metal layer 212 disposed in that order on the first dielectric structure 22. The first metal layer 211 may be a seed layer including, for example, titanium and/or copper, another metal, or an alloy, and may be formed or disposed by sputtering. Alternatively, the first metal layer 211 may be a portion of a copper foil. The second metal layer 212 may include, for example, copper, or another metal or combination of metals, and may be formed or disposed by electroplating. In some embodiments, the first circuitry structure 21 may include a plurality of conductive traces and/or a plurality of bonding pads.

The second circuitry structure 23 may be a patterned circuit layer. As shown in FIG. 1, the second circuitry structure 23 may be a redistribution layer (RDL), and is disposed on the top surface of the first dielectric structure 22. The first via structure 221 is disposed in the first dielectric structure 22, and is electrically connected to the first circuitry structure 21 and the second circuitry structure 23. In some embodiments, the first via structure 221 and the second metal layer 212 of the first circuitry structure 21 are formed integrally and concurrently. However, in another embodiment, the first via structure 221 and the second circuitry structure 23 are formed integrally and concurrently.

The second dielectric structure 24 covers and contacts the second circuitry structure 23 and the top surface of the first dielectric structure 22. The third circuitry structure 25 may be a patterned circuit layer. As shown in FIG. 1, the third circuitry structure 25 may be a redistribution layer (RDL), and is disposed on the top surface of the second dielectric structure 24. The second via structure 241 is disposed in the second dielectric structure 24, and is electrically connected to the second circuitry structure 23 and the third circuitry structure 25. In some embodiments, the second via structure 241 and the third circuitry structure 25 are formed integrally and concurrently. However, in another embodiment, the second via structure 241 and the second circuitry structure 23 are formed integrally and concurrently.

The third dielectric structure 26 covers and contacts the third circuitry structure 25 and the top surface of the second dielectric structure 24. The fourth circuitry structure 27 may be a patterned circuit layer. As shown in FIG. 1, the fourth circuitry structure 27 may be a redistribution layer (RDL), and is disposed on the top surface of the third dielectric structure 26. For example, the fourth circuitry structure 27 may include a first metal layer 271 and a second metal layer 272 disposed in that order on the third dielectric structure 26. The first metal layer 271 may be a seed layer including, for example, titanium and/or copper, another metal, or an alloy, and may be formed or disposed by sputtering. Alternatively, the first metal layer 271 may be a portion of a copper foil. The second metal layer 272 may include, for example, copper, or another metal or combination of metals, and may be formed or disposed by electroplating. In some embodiments, the fourth circuitry structure 27 may include a plurality of conductive traces and/or a plurality of bonding pads. In one or more embodiments, a line width/line space (L/S) of the fourth circuitry structure 27 may be equal to or less than about 3 micrometers (μm)/about 3 μm, equal to or less than about 2 μm/about 2 μm (such as, for example, about 1.8 μm/about 1.8 μm or less, about 1.6 μm/about 1.6 μm or less, or about 1.4 μm/about 1.4 μm or less), equal to or less than about 1 μm/about 1 μm, or equal to or less than about 0.5 μm/about 0.5 μm. An L/S of each of the first circuitry structure 21, the second circuitry structure 23 and the third circuitry structure 25 may be greater than the L/S of the fourth circuitry structure 27.

The third via structure 261 is disposed in the third dielectric structure 26, and is electrically connected to the third circuitry structure 25 and the fourth circuitry structure 27. In some embodiments, the third via structure 261 and the second metal layer 272 of the fourth circuitry structure 27 are formed integrally and concurrently. However, in another embodiment, the third via structure 261 and the third circuitry structure 25 are formed integrally and concurrently.

The first protection layer 28 covers and contacts the bottom surface of the first dielectric structure 22 and at least a portion of the first circuitry structure 21. The first protection layer 28 may define at least one opening to expose a portion of the first circuitry structure 21. The first protection layer 28 may include a solder resist material, such as, for example, epoxy acrylate, benzocyclobutene (BCB) or polyimide. The second protection layer 29 covers and contacts the top surface of the third dielectric structure 26 and at least a portion of the fourth circuitry structure 27. The second protection layer 29 may define at least one opening to expose a portion of the fourth circuitry structure 27. The second protection layer 29 may include a solder resist material, such as, for example, epoxy, acrylate, benzocyclobutene (BCB) or polyimide.

The capture land 30 is disposed in or on the base material 20, and has an outer side surface 303 (e.g., a periphery surface at the exposed end) and a bottom surface 304. In the embodiment illustrated in FIG. 1, the capture land 30 is disposed on the base material 20 and covers a space defined by the inner lateral surface 204 of the base material 20. Thus, a portion of the capture land 30 may cover and contact the top surface 202 of the base material 20. In some embodiments, the capture land 30 is a via stop structure. For example, the via stop structure may be a laser drilling stop structure during a laser drilling process or an etching stop structure during an etching process. In one or more embodiments, the capture land 30 may include a first metal layer 301 and a second metal layer 302 disposed in that order on the third dielectric structure 26. The first metal layer 301 may be a seed layer including, for example, titanium and/or copper, another metal, or an alloy, and may be formed or disposed by sputtering. Alternatively, the first metal layer 301 may be a portion of a copper foil. The second metal layer 302 may include, for example, copper, or another metal or combination of metals, and may be formed or disposed by electroplating. In some embodiments, the capture land 30 is a portion of the fourth circuitry structure 27, or the capture land 30 and the fourth circuitry structure 27 are formed integrally and concurrently. That is, the first metal layer 301 of the capture land 30 and the first metal layer 271 of the fourth circuitry structure 27 are the same layer, and are formed integrally and concurrently. In addition, the second metal layer 302 of the capture land 30 and the second metal layer 272 of the fourth circuitry structure 27 are the same layer, and are formed integrally and concurrently.

Referring to FIG. 2, the indentation structure 4 is the space defined by the inner lateral surface 204 of the base material 20 and the bottom surface 304 of the capture land 30. That is, the inner lateral surface 204 of the base material 20 is the sidewall of the indentation structure 4, and the top of the indentation structure 4 is covered by the capture land 30. The indentation structure 4 is recessed from the outer side surface 203 of the base material 20, and the capture land 30 is disposed adjacent to the indentation structure 4. In some embodiments, the indentation structure 4 includes a first portion (e.g., top portion) 41 and a second portion (e.g., bottom portion) 42. The first portion 41 is disposed adjacent to the capture land 30 and corresponds to the top point $P_1$ of the inner lateral surface 204. The second portion 42 is disposed away from the capture land 30 and corresponds to the bottom point $P_2$ of the inner lateral surface 204. A second width W2 of the second portion 42 is greater than a first width $W_1$ of the first portion 41 (e.g., may be about 1.1 or more times greater, about 1.3 or more times greater, about 1.5 or more times greater, or about 1.7 or more times greater). That is, the indentation structure 4 is tapered from the second portion (bottom portion) 42 to the first portion (top portion) 41. This is because that the inner lateral surface 204 of the base material 20 is formed from a hole that is formed by laser drilling. In addition, the capture land 30 has a third width W3 that is greater than the first width $W_1$ of the first portion 41 of the indentation structure 4 (e.g., may be about 1.3 or more times greater, about 1.5 or more times greater, about 1.7 or more times greater, or about 2.0 or more times greater). The third width W3 of the capture land 30 may be greater than or less than the second width W2 of the second portion 42 of the indentation structure 4.

Referring to FIG. 1, the interconnection structure 32 is disposed along and on the inner lateral surface 204 of the base material 20 in the indentation structure 4, that is, at least a portion of the interconnection structure 32 is disposed within the indentation structure 4. A material of the interconnection structure 32 may include copper, and the interconnection structure 32 may be formed by electroplating. As shown in FIG. 1, the interconnection structure 32 includes a first end 321 and a second end 322. The first end 321 is disposed on and contacts the capture land 30, so that the interconnection structure 32 is connected to the capture land 30. The first end 321 of the interconnection structure 32 has an outer side surface 323 (e.g., an exposed periphery surface). The second end 322 extends to the bottom surface 201 of the base material 20. In some embodiments, the second end 322 is a portion of the first circuitry structure 21, That is, the second end 322 of the interconnection structure 32 includes two metal layers that are the same as the first circuitry structure 21. In some embodiments, the interconnection structure 32 and the second metal layer 212 of the first circuitry structure 21 are the same layer, and are formed integrally and concurrently. As shown in FIG. 1, the outer side surface 323 of the interconnection structure 32 is substantially coplanar with the outer side surface 303 of the capture land 30 since they are formed concurrently after a cutting process.

The semiconductor chip 14 and the passive device 16 are disposed adjacent to the top surface 202 of the base material 20. As shown in FIG. 1, the semiconductor chip 14 and the passive device 16 are disposed on and electrically connected the fourth circuitry structure 27 on the top surface 202 of the base material 20. For example, the semiconductor chip 14 is bonded to the base material 20 by flip chip bonding, and the passive device 16 is bonded to the base material 20 by surface mounting technique (SMT).

The encapsulant 18, for example, molding compound, is disposed adjacent to the top surface 202 of the base material 20 to cover the semiconductor chip 14, the passive device 16 and the substrate 2. As shown in FIG. 1, the encapsulant 18 covers and contacts the semiconductor chip 14, the passive device 16, the second protection layer 29 and the capture land 30. The encapsulant 18 has an outer side surface 183 (e.g., a periphery lateral surface). The outer side surface 183 of the encapsulant 18 is substantially coplanar with the outer side surface 323 of the interconnection structure 32 and the outer side surface 303 of the capture land 30 since they are formed concurrently after a cutting process.

Figure 3:
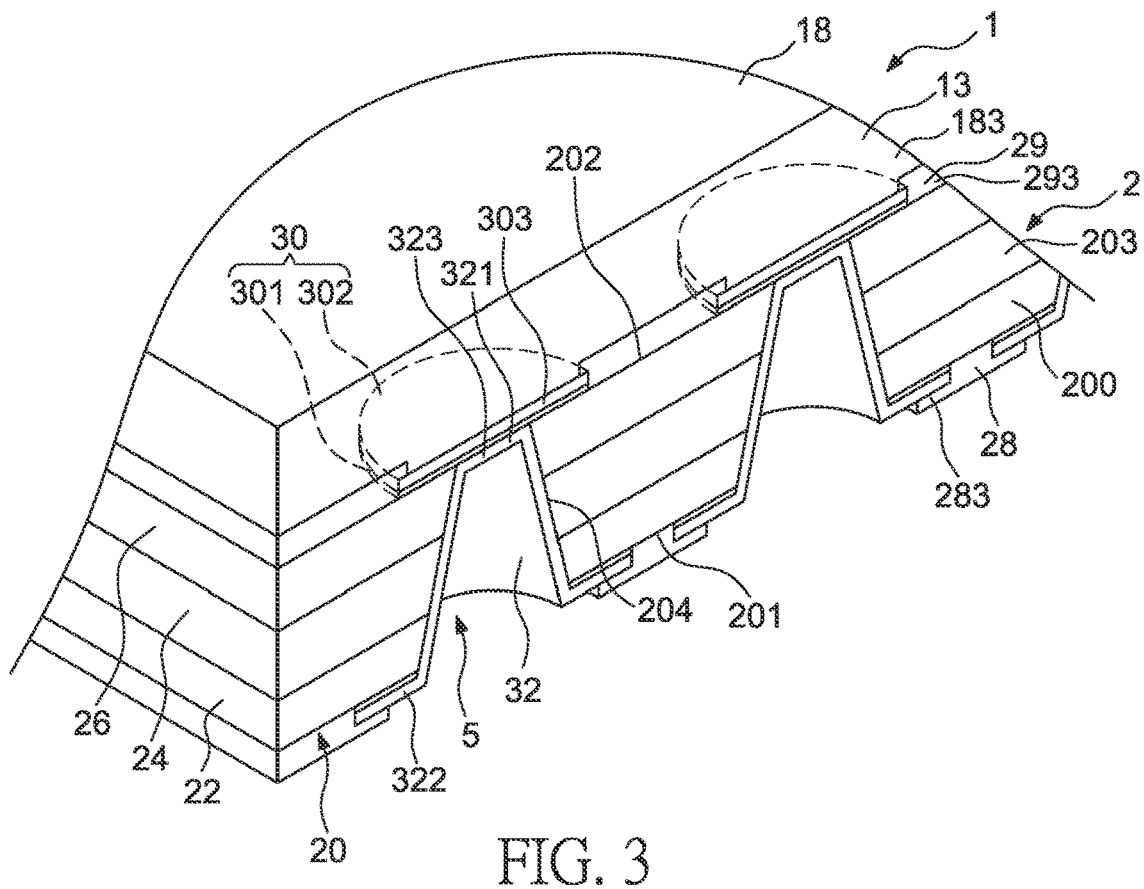
FIG. 3 illustrates a perspective view of a portion of the semiconductor package of FIG. 1.

FIG. 3 illustrates a perspective view of a portion of the semiconductor package 1 of FIG. 1. The interconnection structure 32 defines a recess portion 5 recessed from the outer side surface 203 of the base material 20. That is, the interconnection structure 32 does not fill the indentation structure 4. The recess portion 5 is conformal with the indentation structure 4 or the inner lateral surface 204 of the base material 20. As shown in FIG. 3, an outer side surface 200 of the substrate 2 includes the outer side surface 203 of the base material 20, an outer side surface 283 of the first protection layer 28, an outer side surface 293 of the second protection layer 29, the outer side surface 323 of the interconnection structure 32 and the outer side surface 303 of the capture land 30 that are coplanar with each other since they are formed concurrently after a cutting process. In addition, an outer side surface 13 of the semiconductor package 1 includes the outer side surface 183 of the encapsulant 18 and the outer side surface 200 of the substrate 2 (e.g., including the outer side surface 203 of the base material 20, the outer side surface 283 of the first protection layer 28, the outer side surface 293 of the second protection layer 29, the outer side surface 323 of the interconnection structure 32 and the outer side surface 303 of the capture land 30) that are coplanar with each other since they are formed concurrently after a cutting process.

Figure 4:
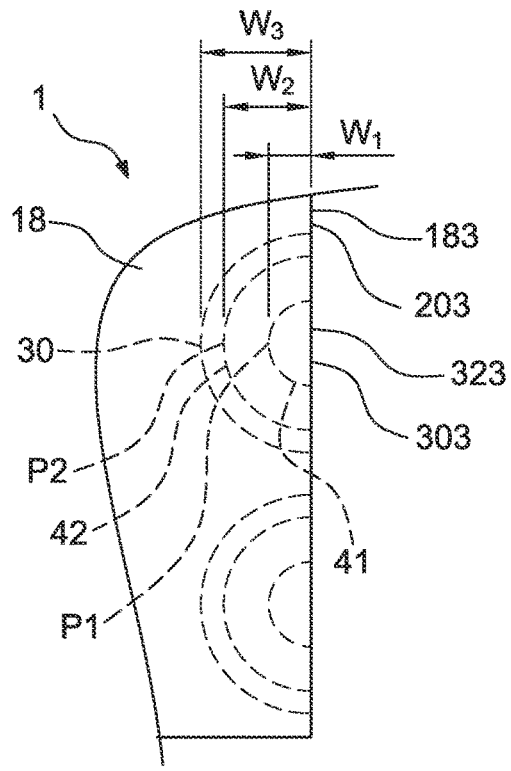
FIG. 4 illustrates a top view of the portion of the semiconductor package of FIG. 3.

FIG. 4 illustrates a top view of the portion of the semiconductor package 1 of FIG. 3. The shapes of the capture land 30, first portion 41 of the indentation structure 4 and the second portion 42 of the indentation structure 4 may be semi-circular or semi-elliptical, and may be concentric with respect to each other. As shown in FIG. 4, the third width W3 of the capture land 30 is greater than the second width W2 of the second portion 42 of the indentation structure 4, and the second width W2 of the second portion 42 of the indentation structure 4 is greater than the first width $W_1$ of the first portion 41 of the indentation structure 4.

In the illustrated embodiment of the semiconductor package 1 shown in FIG. 1 through FIG. 4, the semiconductor package 1 may be a castellated package, and can be over molded because the capture land 30 can prevent the encapsulant 18 from entering the indentation structure 4 or the recess portion 5 during a molding process. Thus, when the semiconductor package 1 is attached to a motherboard by using, for example, surface mounting technique (SMT), solder can wick up the interconnection structure 32 and form a solder fillet which can be inspected for joint quality, and the yield rate and the soldering reliability of the surface mounting technique (SMT) are improved. Further, during a singulation process, the interconnection structure 32 is covered by the capture land 30 and the encapsulant 18, thus the interconnection structure 32 will not be ripped from the base material 20. In addition, the semiconductor package 1 includes the substrate 2, thus, additional interposer is not necessary, and the cost of semiconductor package 1 can be reduced. In addition, the substrate 2 includes four metal layers (e.g., the first circuitry structure 21, the second circuitry structure 23, the third circuitry structure 25 and the fourth circuitry structure 27). However, in other embodiments, the substrate 2 may include any number of metal layers greater than two.

Figure 5:
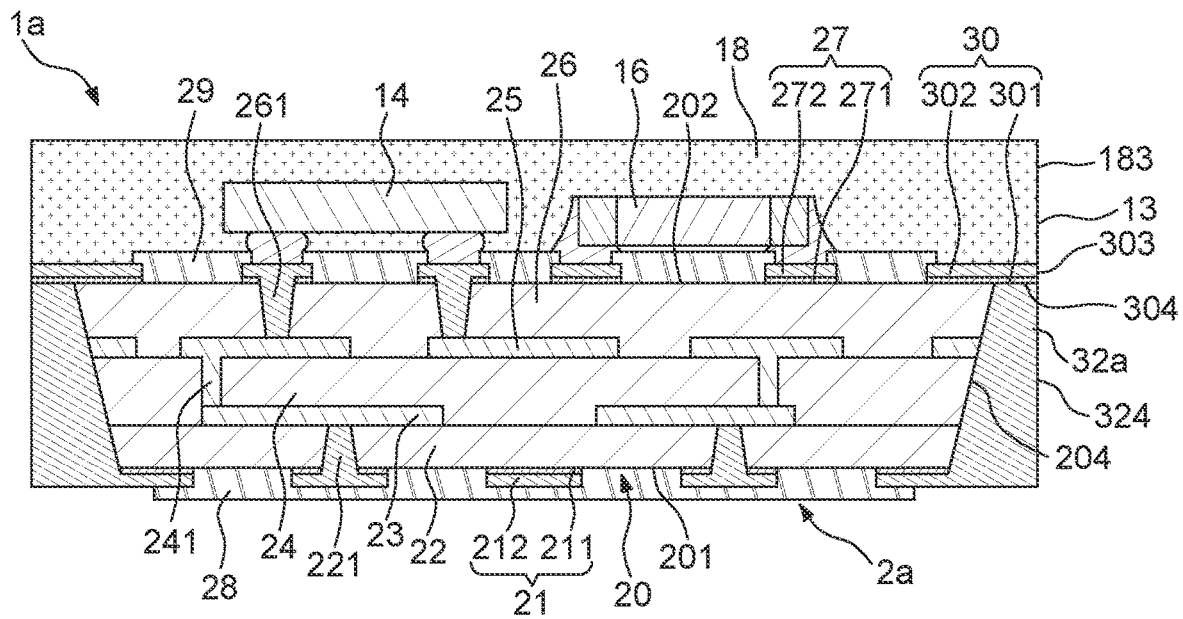
FIG. 5 illustrates a cross-sectional view of a semiconductor package according to some embodiments of the present disclosure.
Figure 6:
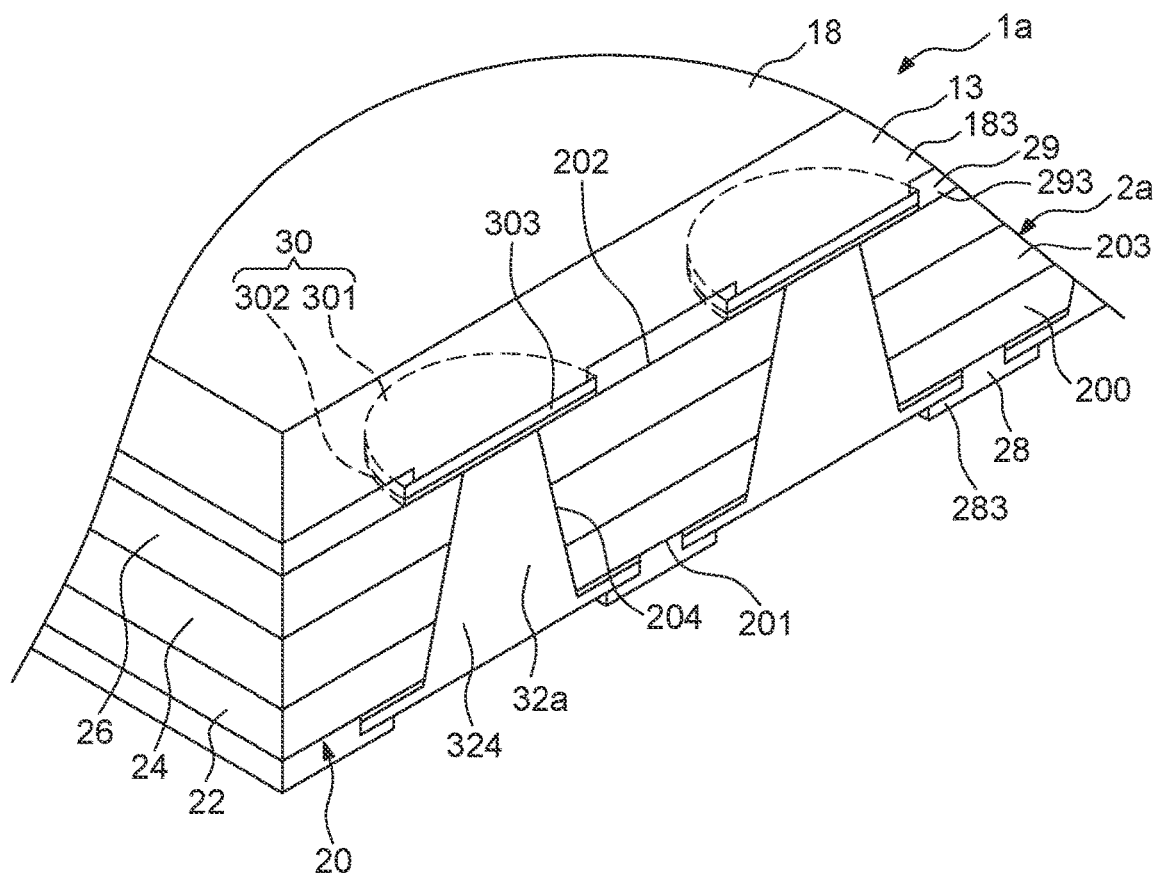
FIG. 6 illustrates a perspective view of a portion of the semiconductor package of FIG. 5.

FIG. 5 illustrates a cross-sectional view of a semiconductor package 1a according to some embodiments of the present disclosure. FIG. 6 illustrates a perspective view of a portion of the semiconductor package 1a of FIG. 5. The semiconductor package 1a is similar to the semiconductor package 1 shown in FIG. 1 through FIG. 4, except for the structure of the interconnection structure 32a of the substrate 2a. The interconnection structure 32a of the substrate 2a of the semiconductor package 1a fills the indentation structure 4. Thus, the recess portion 5 of FIG. 3 will not occur. As shown in FIG. 5, the interconnection structure 32a is tapered from its bottom end (corresponding to the second portion 42 of the indentation structure 4) to its top end (corresponding to the first portion 41 of the indentation structure 4). As shown in FIG. 6, an outer side surface 324 of the interconnection structure 32a is substantially coplanar with the outer side surface 203 of the base material 20, the outer side surface 283 of the first protection layer 28, the outer side surface 293 of the second protection layer 29, the outer side surface 303 of the capture land 30 and the outer side surface 183 of the encapsulant 18 since they are formed concurrently after a cutting process.

Figure 7:
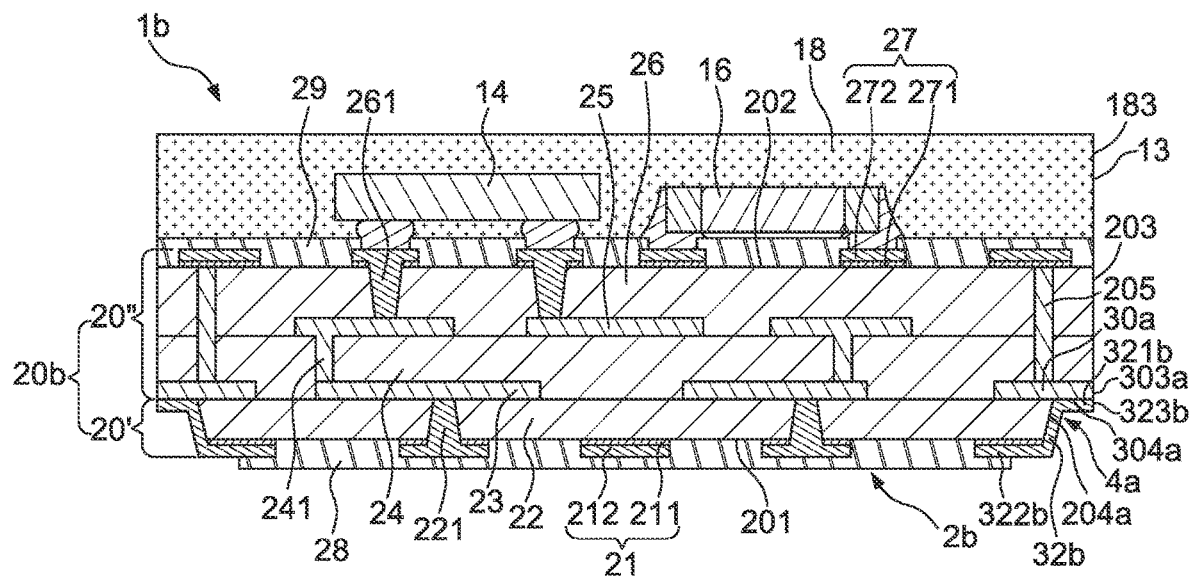
FIG. 7 illustrates a cross-sectional view of a semiconductor package according to some embodiments of the present disclosure.
Figure 8:
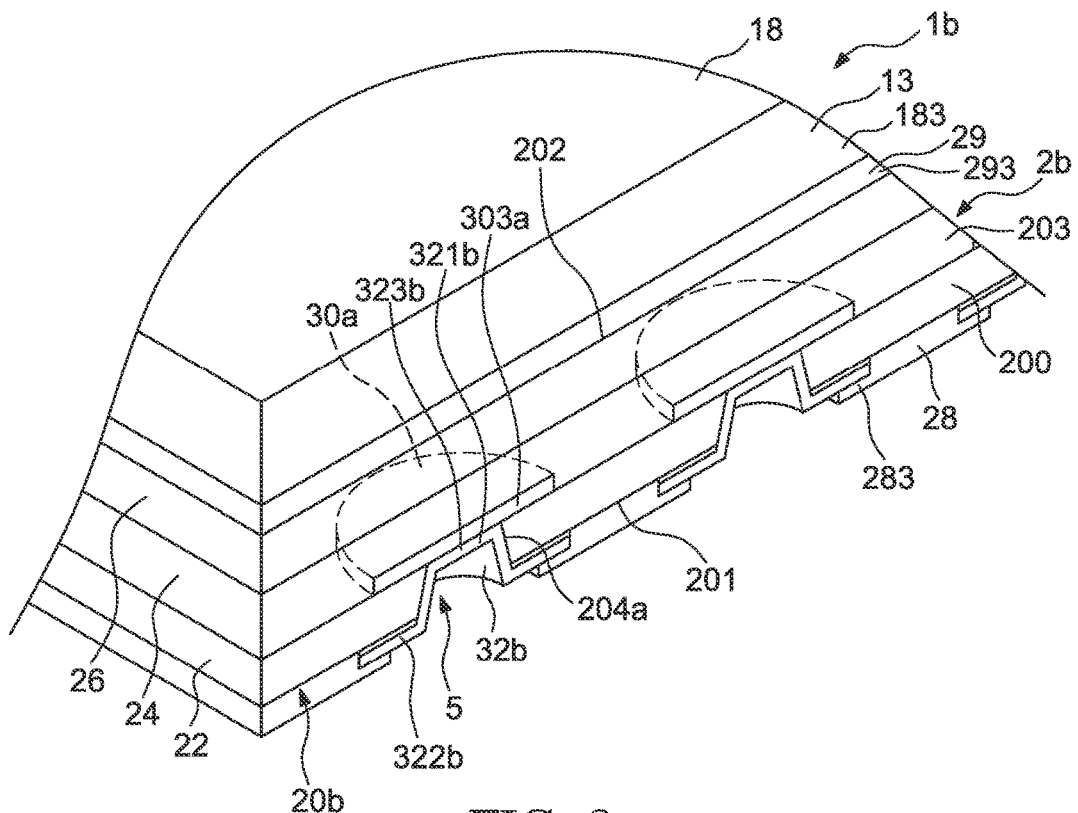
FIG. 8 illustrates a perspective view of a portion of the semiconductor package of FIG. 7.

FIG. 7 illustrates a cross-sectional view of a semiconductor package 1b according to some embodiments of the present disclosure. FIG. 8 illustrates a perspective view of a portion of the semiconductor package 1b of FIG. 7. The semiconductor package 1b is similar to the semiconductor package 1 shown in FIG. 1 through FIG. 4, except for the structure of the substrate 2b. The substrate 2b includes a base material 20b, and the base material 20b includes a first sub-base material 20' and a second sub-base material 20". The first sub-base material 20' includes the first circuitry structure 21, the first dielectric structure 22 and the first via structure 221, and has an inner lateral surface 204a recessed from the outer side surface 203 of the base material 20b. The second sub-base material 20" includes the second circuitry structure 23, the second dielectric structure 24, the second via structure 241, the third circuitry structure 25, the third dielectric structure 26, the third via structure 261 and the fourth circuitry structure 27.

The capture land 30a is disposed on the first dielectric structure 22 of the first sub-base material 20', and is embedded in the second dielectric structure 24 of the second sub-base material 20". The capture land 30a has an outer side surface 303a (e.g., a periphery surface at the exposed end) and a bottom surface 304a. In the embodiment illustrated in FIG. 7, the capture land 30a covers a space defined by the inner lateral surface 204a of the first sub-base material 20'. In some embodiments, the capture land 30a is a portion of the second circuitry structure 23, or the capture land 30a and the second circuitry structure 23 are formed integrally and concurrently.

Referring to FIG. 7, the indentation structure 4a is the space defined by the inner lateral surface 204a of the first sub-base material 20' and the bottom surface 304a of the capture land 30a. That is, the inner lateral surface 204a of the first sub-base material 20' is the sidewall of the indentation structure 4a, and the top of the indentation structure 4a is covered by the capture land 30a. The indentation structure 4a selectively extends through the first sub-base material 20', and does not extend through the base material 20b. The indentation structure 4a is recessed from the outer side surface 203 of the base material 20b, and the indentation structure 4a is tapered from its bottom portion to its top portion.

Referring to FIG. 7, the interconnection structure 32b is disposed along and on the inner lateral surface 204a of the first sub-base material 20' in the indentation structure 4a. The first end 321b of the interconnection structure 32b is disposed on and contacts the capture land 30a, so that the interconnection structure 32b is connected to the capture land 30a. The second end 322b of the interconnection structure 32b extends to the bottom surface 201 of the base material 20b. In some embodiments, the second end 322b is a portion of the first circuitry structure 21. In some embodiments, the interconnection structure 32b and the second metal layer 212 of the first circuitry structure 21 are the same layer, and are formed integrally and concurrently. As shown in FIG. 7, the outer side surface 323b of the interconnection structure 32b is substantially coplanar with the outer side surface 303a of the capture land 30a since they are formed concurrently after a cutting process. In addition, a portion of the second dielectric structure 24, a portion of the third dielectric structure 26, a portion of the fourth circuitry structure 27 and a via structure 205 are disposed above the indentation structure 4a and the capture land 30a. The via structure 205 connects the fourth circuit layer 27 and the capture land 30a. As shown in FIG. 7, the indentation structure 4a extends from the first circuitry structure 21 to the second circuitry structure 23 for simplicity sake. However, in other embodiments, the indentation structure 4a may also extend to the third circuitry structure 25 in a four-layered substrate or any intermediate circuit layer in a higher circuit layer count substrate.

Figure 9:
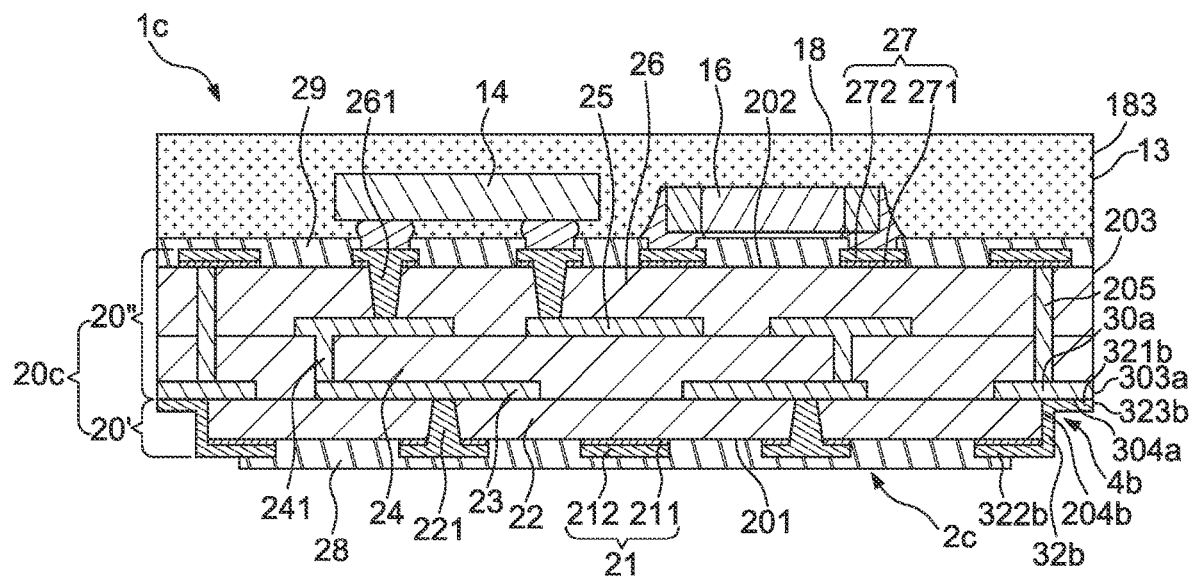
FIG. 9 illustrates a cross-sectional view of a semiconductor package according to some embodiments of the present disclosure.
Figure 10:
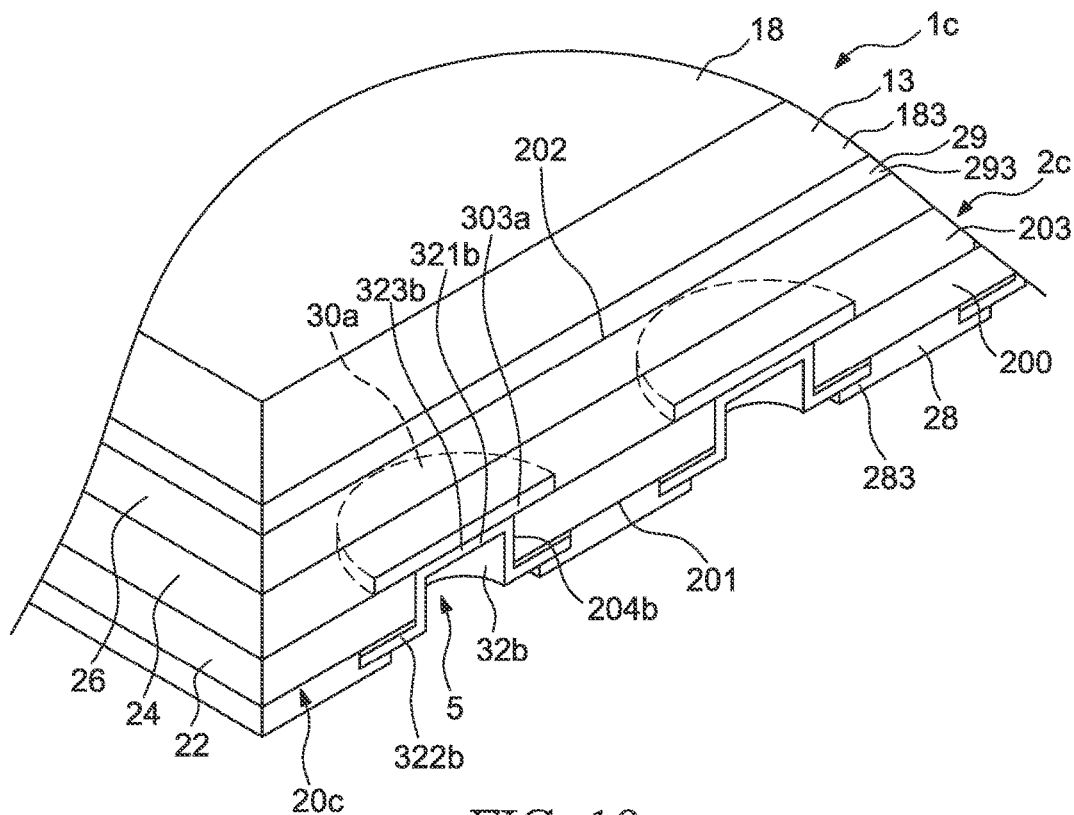
FIG. 10 illustrates a perspective view of a portion of the semiconductor package of FIG. 9.

FIG. 9 illustrates a cross-sectional view of a semiconductor package 1c according to some embodiments of the present disclosure. FIG. 10 illustrates a perspective view of a portion of the semiconductor package 1c of FIG. 9. The semiconductor package 1c is similar to the semiconductor package 1b shown in FIG. 7 through FIG. 8, except for the structure of the indentation structure 4b of the substrate 2c. As shown FIG. 9, the inner lateral surface 204b of the first sub-base material 20' is substantially perpendicular to the bottom surface 201 of the base material 20c and the bottom surface 304a of the capture land 30a. This is because that the inner lateral surface 204b of the first sub-base material 20' is formed from a hole that is formed by blade sawing, exposure and development, or laser drilling.

Figure 11:
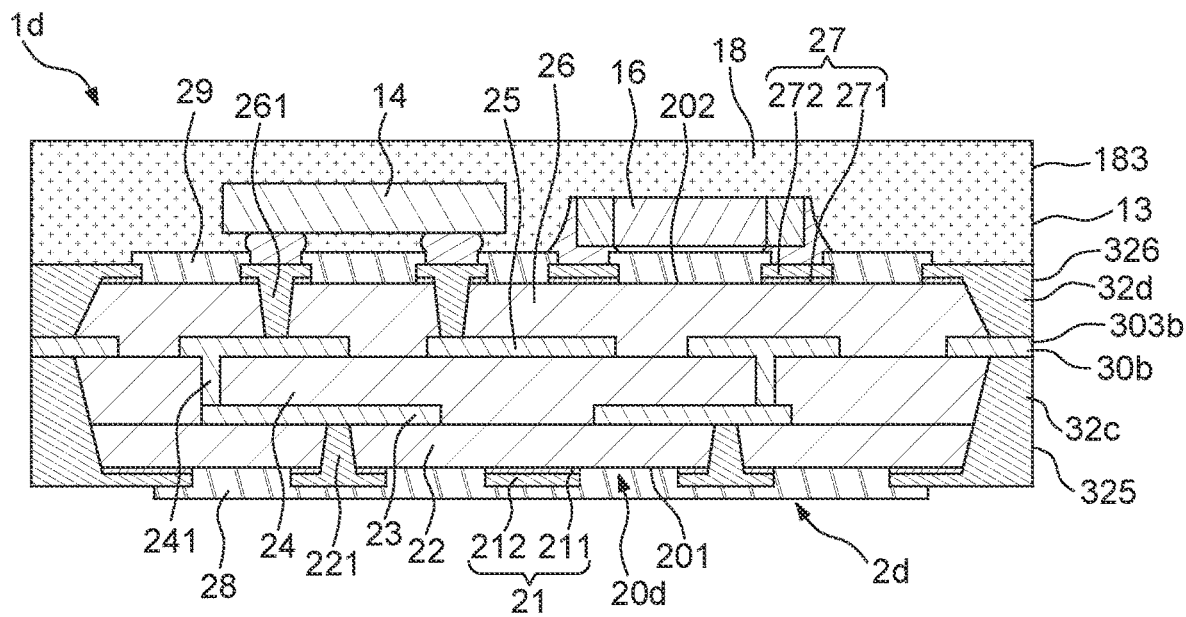
FIG. 11 illustrates a cross-sectional view of a semiconductor package according to some embodiments of the present disclosure.
Figure 12:
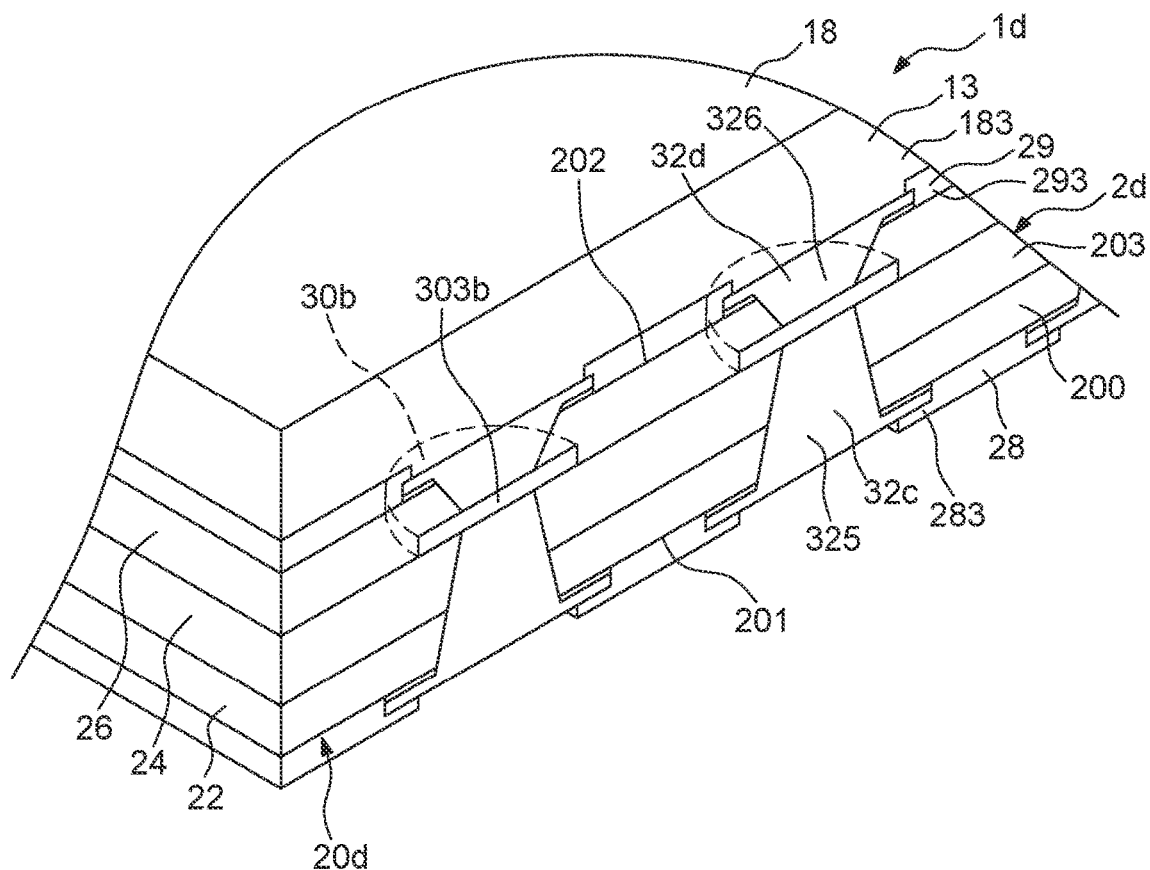
FIG. 12 illustrates a perspective view of a portion of the semiconductor package of FIG. 11.

FIG. 11 illustrates a cross-sectional view of a semiconductor package 1d according to some embodiments of the present disclosure. FIG. 12 illustrates a perspective view of a portion of the semiconductor package 1d of FIG. 12. The semiconductor package 1d is similar to the semiconductor package 1a shown in FIG. 5 through FIG. 6, except for the structures of the interconnection structures 32c, 32d of the substrate 2d. As shown in FIG. 11 and FIG. 12, the substrate 2d includes a base material 20d, at least one lower interconnection structure 32c and at least one upper interconnection structure 32d. The lower interconnection structure 32c is tapered from its bottom end to its top end, and the top end of the lower interconnection structure 32c connects a bottom surface of a capture land 30b. The upper interconnection structure 32d is tapered from its top end to its bottom end, and the bottom end of the upper interconnection structure 32d connects a top surface of the capture land 30b. The capture land 30b is a portion of the third circuitry structure 25. The upper interconnection structure 32d is disposed right above the lower interconnection structure 32c. In some embodiments, the lower interconnection structure 32c and the first circuitry structure 21 are formed integrally and concurrently, and the upper interconnection structure 32d and the fourth circuitry structure 27 are formed integrally and concurrently. As shown FIG. 12, an outer side surface 325 of the lower interconnection structure 32c, an outer side surface 303b of the capture land 30b, an outer side surface 326 of the upper interconnection structure 32d, the outer side surface 203 of the base material 20d, the outer side surface 283 of the first protection layer 28, the outer side surface 293 of the second protection layer 29 and the outer side surface 183 of the encapsulant 18 are substantially coplanar with each other since they are formed concurrently after a cutting process. In other embodiments, the center of the capture land 30b may be drilled through. The resultant central opening in the capture land 30b will be filled with copper during a simultaneous plating of the lower interconnection structure 32c and the upper interconnection structure 32d.

Figure 13:
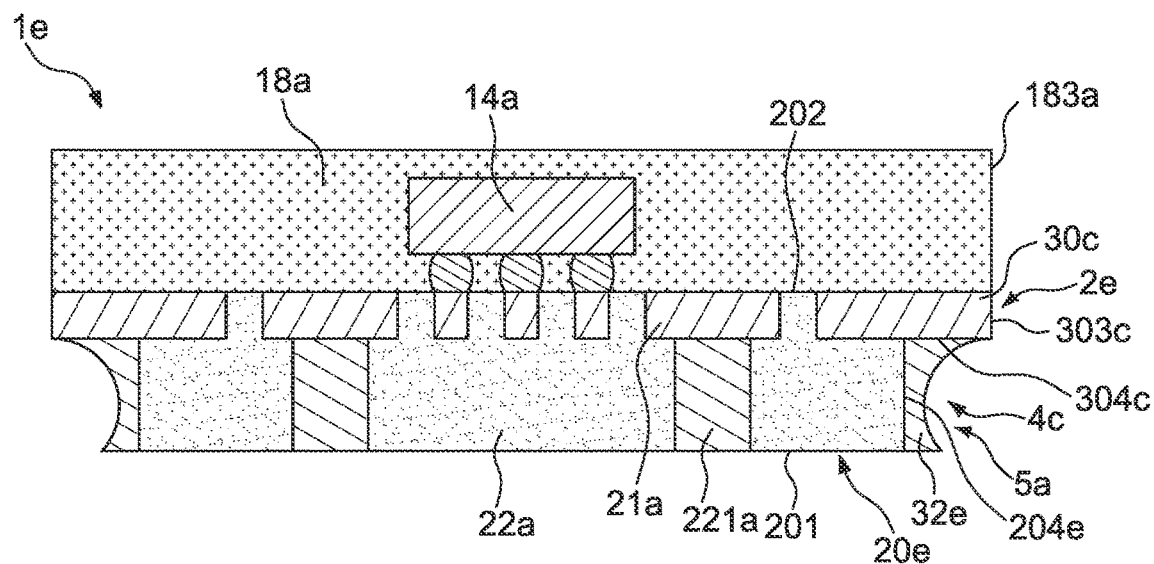
FIG. 13 illustrates a cross-sectional view of a semiconductor package according to some embodiments of the present disclosure.
Figure 14:
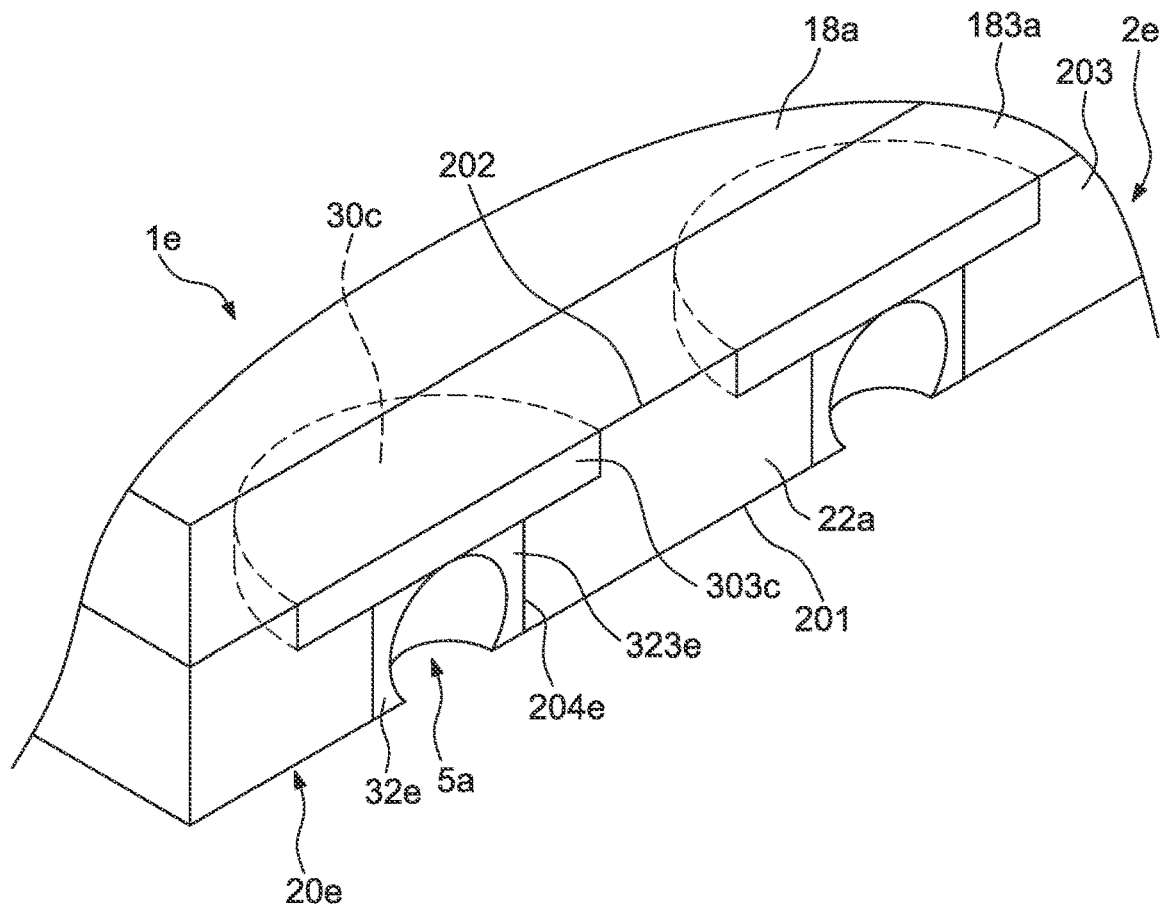
FIG. 14 illustrates a perspective view of a portion of the semiconductor package of FIG. 13.

FIG. 13 illustrates a cross-sectional view of a semiconductor package 1e according to some embodiments of the present disclosure. FIG. 14 illustrates a perspective view of a portion of the semiconductor package 1e of FIG. 13. The semiconductor package 1e includes a substrate 2e, at least one semiconductor chip 14a and an encapsulant 18a. The substrate 2e is used for carrying the semiconductor chip 14a, and may include a base material 20e, a capture land 30c, an interconnection structure 32e and an indentation structure 4c. The base material 20e has a bottom surface 201, a top surface 202, an outer side surface 203 (FIG. 14) and an inner lateral surface 204e. The top surface 202 is opposite to the bottom surface 201. The outer side surface 203 extends between the bottom surface 201 and the top surface 202. The inner lateral surface 204e is recessed form the outer side surface 203.

The base material 20e includes a first circuitry structure 21a, a first dielectric structure 22a and a first via structure 221a. The first dielectric structure 22a may be a molding compound, a dielectric layer or a passivation layer and may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof. In one or more embodiments, the first dielectric structure 22a may include, or be formed from a dry film type material that includes a resin and a plurality of fillers. In another embodiment, the first dielectric structure 22a may include, or be formed from a liquid type material that includes a homogeneous resin without fillers.

The first circuitry structure 21a may be a patterned circuit layer. As shown in FIG. 13, the first circuitry structure 21a may be a redistribution layer (RDL), and is embedded in the first dielectric structure 22a and exposed from the top surface of the first dielectric structure 22a (e.g., the top surface 202 of the base material 20e). In some embodiments, the first circuitry structure 21a may include a plurality of conductive traces and/or a plurality of bonding pads. In one or more embodiments, a line width/line space (L/S) of the first circuitry structure 21a may be equal to or less than about 3 micrometers (μm)/about 3 equal to or less than about 2 μm/about 2 (such as, for example, about 1.8 μm/about 1.8 μm or less, about 1.6 μm/about 1.6 μm or less, or about 1.4 μm/about 1.4 μm or less), equal to or less than about 1 μm/about 1 or equal to or less than about 0.5 μm/about 0.5 μm.

The first via structure 221a is disposed in the first dielectric structure 22a. One end of the first via structure 221a connects the first circuitry structure 21a, and the other end of the first via structure 221a is exposed from the bottom surface of the first dielectric structure 22a (e.g., the bottom surface 201 of the base material 20e).

The capture land 30c is disposed in the base material 20, and has an outer side surface 303c (e.g., a periphery surface at the exposed end) and a bottom surface 304c. In the embodiment illustrated in FIG. 13, the top surface of the capture land 30c is coplanar with the top surface of the first dielectric structure 22a (e.g., the top surface 202 of the base material 20e). The capture land 30c covers a space defined by the inner lateral surface 204e of the base material 20e. In some embodiments, the capture land 30c is a portion of the first circuitry structure 21a, or the capture land 30c and the first circuitry structure 21a are formed integrally and concurrently.

The indentation structure 4c is the space defined by the inner lateral surface 204e of the base material 20e and the bottom surface 304c of the capture land 30c. That is, the inner lateral surface 204e of the base material 20e is the sidewall of the indentation structure 4c, and the top of the indentation structure 4c is covered by the capture land 30c. The indentation structure 4c is recessed from the outer side surface 203 of the base material 20e.

The interconnection structure 32e is disposed along and on the inner lateral surface 204e of the base material 20e in the indentation structure 4c. The interconnection structure 32e may be formed by etching. The interconnection structure 32e has an outer side surface 323e (e.g., an exposed periphery surface). In some embodiments, the first via structure 221a and the solid portion of the interconnection structure 32e are formed integrally and concurrently. As shown in FIG. 14, the outer side surface 323e of the interconnection structure 32e is substantially coplanar with the outer side surface 303c of the capture land 30c since they are formed concurrently after a cutting process.

The semiconductor chip 14a is disposed adjacent to the top surface 202 of the base material 20e. As shown in FIG. 13, the semiconductor chip 14a is disposed on and electrically connected the first circuitry structure 21a by, for example, flip chip bonding. The encapsulant 18a, for example, molding compound, is disposed adjacent to the top surface 202 of the base material 20e to cover the semiconductor chip 14a and the substrate 2e. As shown in FIG. 13, the encapsulant 18a covers and contacts the semiconductor chip 14a, the base material 20e and the capture land 30c. The encapsulant 18a has an outer side surface 183a (e.g., a periphery lateral surface). The outer side surface 183a of the encapsulant 18a is substantially coplanar with the outer side surface 323e of the interconnection structure 32e and the outer side surface 303c of the capture land 30c since they are formed concurrently after a cutting process. For simplicity sake, one chip (e.g., the semiconductor chip 14a) is shown although it is contemplated that as for any System-in-Package, additional chips and or passive device may be added on the top side.

Referring to FIG. 14, the interconnection structure 32e defines a recess portion 5a recessed from the outer side surface 203 of the base material 20e. That is, the interconnection structure 32e does not full the indentation structure 4c.

Figure 15:
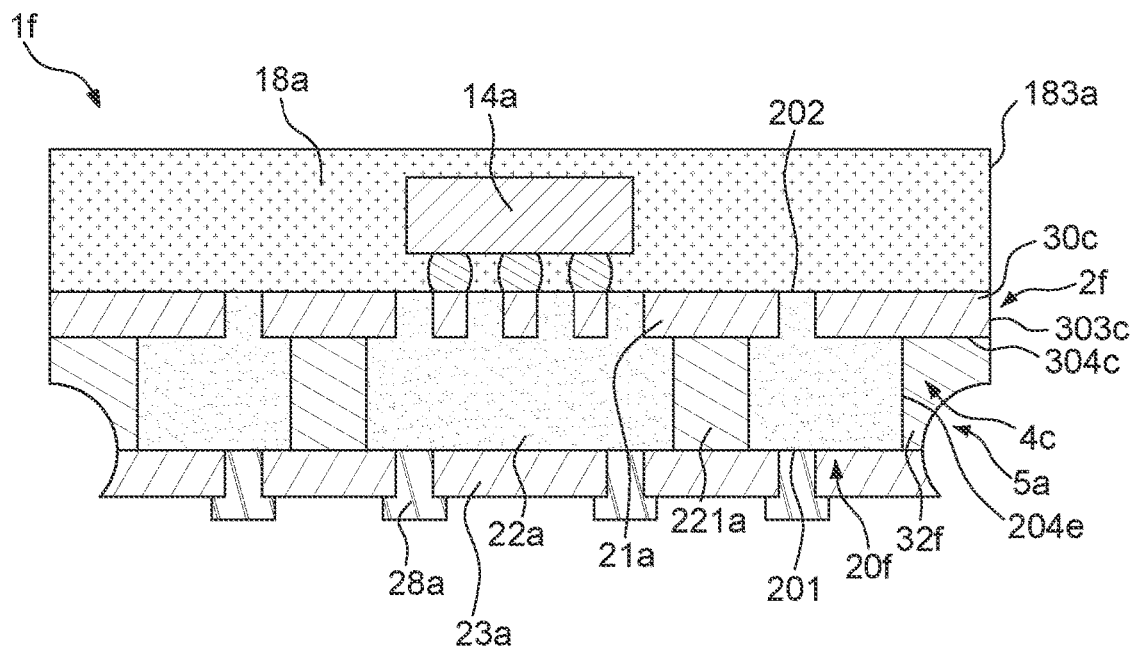
FIG. 15 illustrates a cross-sectional view of a semiconductor package according to some embodiments of the present disclosure.

FIG. 15 illustrates a cross-sectional view of a semiconductor package if according to some embodiments of the present disclosure. The semiconductor package if is similar to the semiconductor package 1e shown in FIG. 13 through FIG. 14, except that the semiconductor package if further includes a second circuitry structure 23a and a first protection layer 28a. The second circuitry structure 23a may be a patterned circuit layer. As shown in FIG. 15, the second circuitry structure 23a may be a redistribution layer (RDL), and is disposed on the bottom surface 201 of the base material 20f. Thus, the second circuitry structure 23a is electrically connected to the first circuitry structure 21a through the first via structure 221a. In addition, the second circuitry structure 23a is electrically connected to the capture land 30c through the interconnection structure 32f. In some embodiments, the second circuitry structure 23a may include a plurality of conductive traces and/or a plurality of bonding pads. In one or more embodiments, an L/S of the second circuitry structure 23a may be greater than the L/S of the first circuitry structure 21a.

The first protection layer 28a covers and contacts the bottom surface of the first dielectric structure 22a (e.g., the bottom surface 201 of the base material 20f) and at least a portion of the second circuitry structure 23a. The first protection layer 28a may include a solder resist material, such as, for example, benzocyclobutene (BCB) or polyimide. In some embodiments, the first protection layer 28a may define a plurality of openings to expose portions of the second circuitry structure 23a. For simplicity sake, a two layered-substrate has been illustrated here. However, multi-layered substrates of the same external structure may be employed as applicable.

Figure 16:
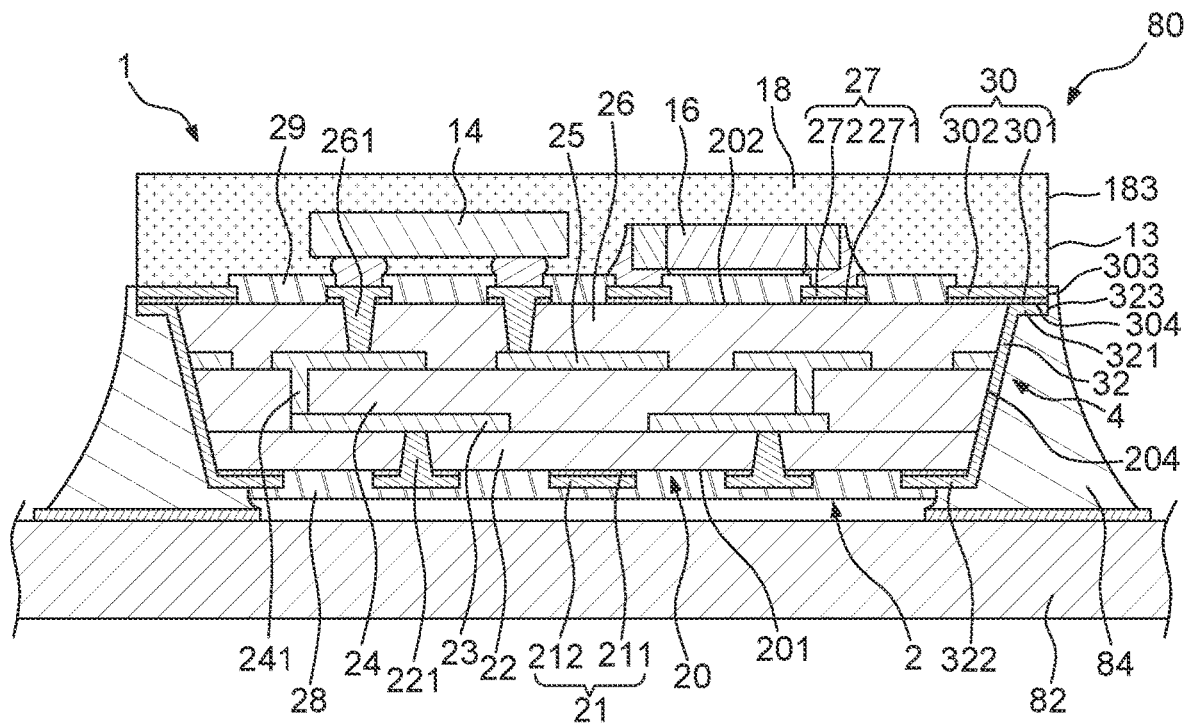
FIG. 16 illustrates a cross-sectional view of an assembly of the semiconductor package and a motherboard according to some embodiments of the present disclosure.

FIG. 16 illustrates a cross-sectional view of an assembly 80 of the semiconductor package 1 and a motherboard 82 according to some embodiments of the present disclosure. The semiconductor package 1 of the assembly 80 is the same as the semiconductor package 1 of FIG. 1 to FIG. 4, and is bonded to the motherboard 82 through the solder 84. As shown in FIG. 16, when the semiconductor package 1 is attached to the motherboard 82 by using, for example, surface mounting technique (SMT), the solder 84 can wick up the interconnection structure 32 and form a solder fillet which can be inspected for joint quality, and the yield rate and the soldering reliability of the surface mounting technique (SMT) are improved. That is, the side surfaces of the semiconductor package 1 are solder wettable flanks.

FIG. 17 through FIG. 24 illustrate a method for manufacturing a semiconductor package according to some embodiments of the present disclosure. In some embodiments, the method is for manufacturing a semiconductor package such as the semiconductor package 1 shown in FIG. 1 to FIG. 4.

Figure 17:
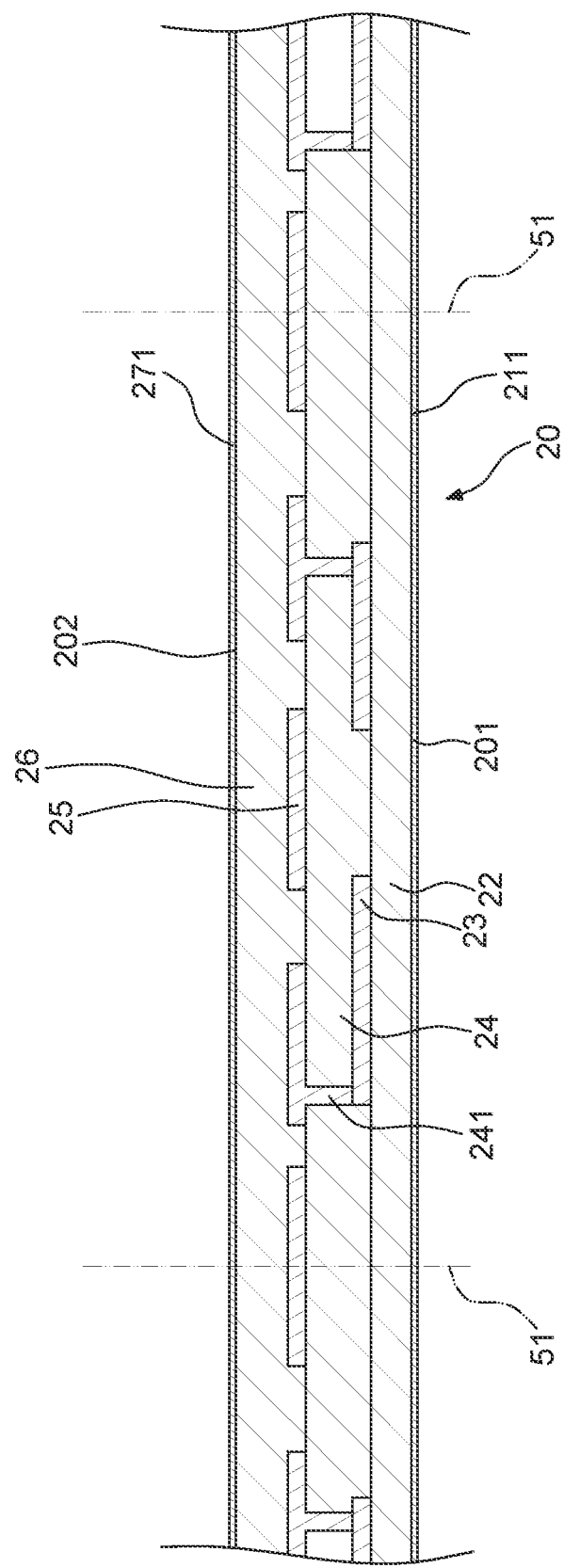
FIG. 17 illustrates one or more stages of an example of a method for manufacturing a semiconductor package according to some embodiments of the present disclosure.

Referring to FIG. 17, a base material 20 is provided. The base material 20 has a bottom surface 201, a top surface 202 opposite to the bottom surface 201 and a plurality of singulation lines 51. The base material 20 includes a first metal layer 211, a first dielectric structure 22, a second circuitry structure 23, a second dielectric structure 24, a second via structure 241, a third circuitry structure 25, a third dielectric structure 26 and a first metal layer 271. The first dielectric structure 22, the second circuitry structure 23, the second dielectric structure 24, the second via structure 241, the third circuitry structure 25 and the third dielectric structure 26 may be the same as the first dielectric structure 22, the second circuitry structure 23, the second dielectric structure 24, the second via structure 241, the third circuitry structure 25 and the third dielectric structure 26 as stated above, respectively. In some embodiments, the first metal layer 211 may be a copper foil or a seed layer, and may be formed or disposed on the bottom surface 201 of the base material 20 by pressing or adhesion. Similarly, the first metal layer 271 may be a copper foil or a seed layer, and may be formed or disposed on the top surface 202 of the base material 20 by pressing or adhesion. The singulation lines 51 are the paths of the sawing blade or the laser during a singulation process.

Figure 18:
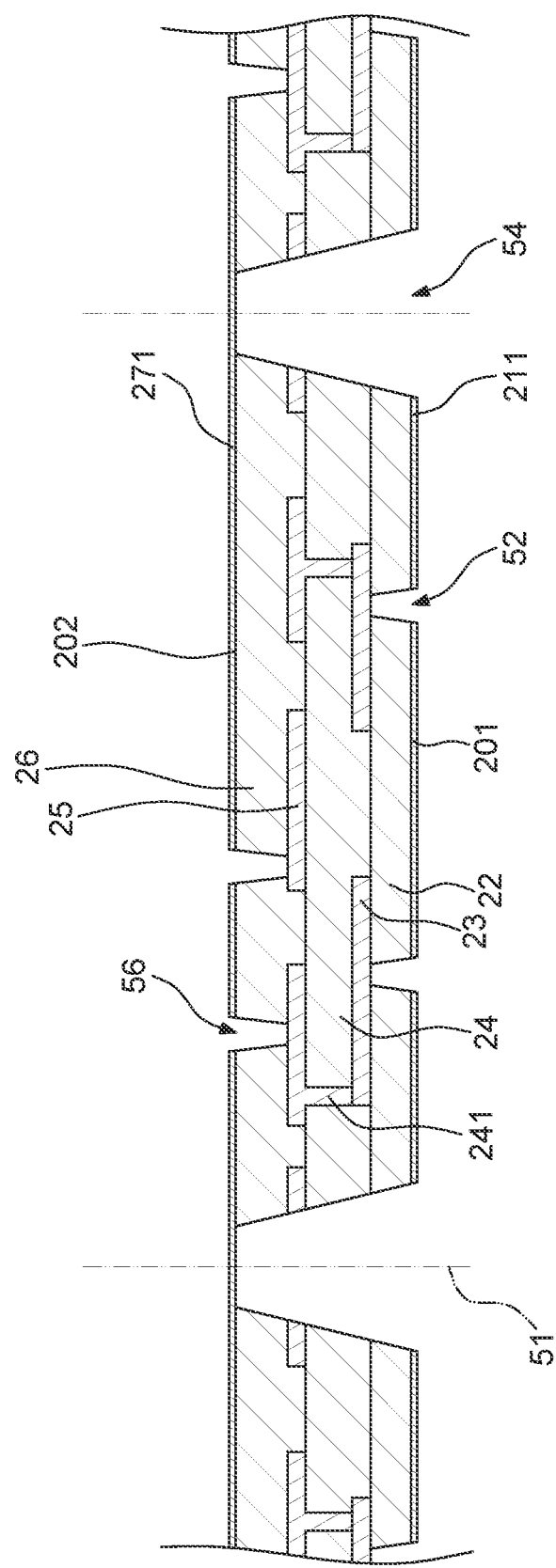
FIG. 18 illustrates one or more stages of an example of a method for manufacturing a semiconductor package according to some embodiments of the present disclosure.
Figure 20:
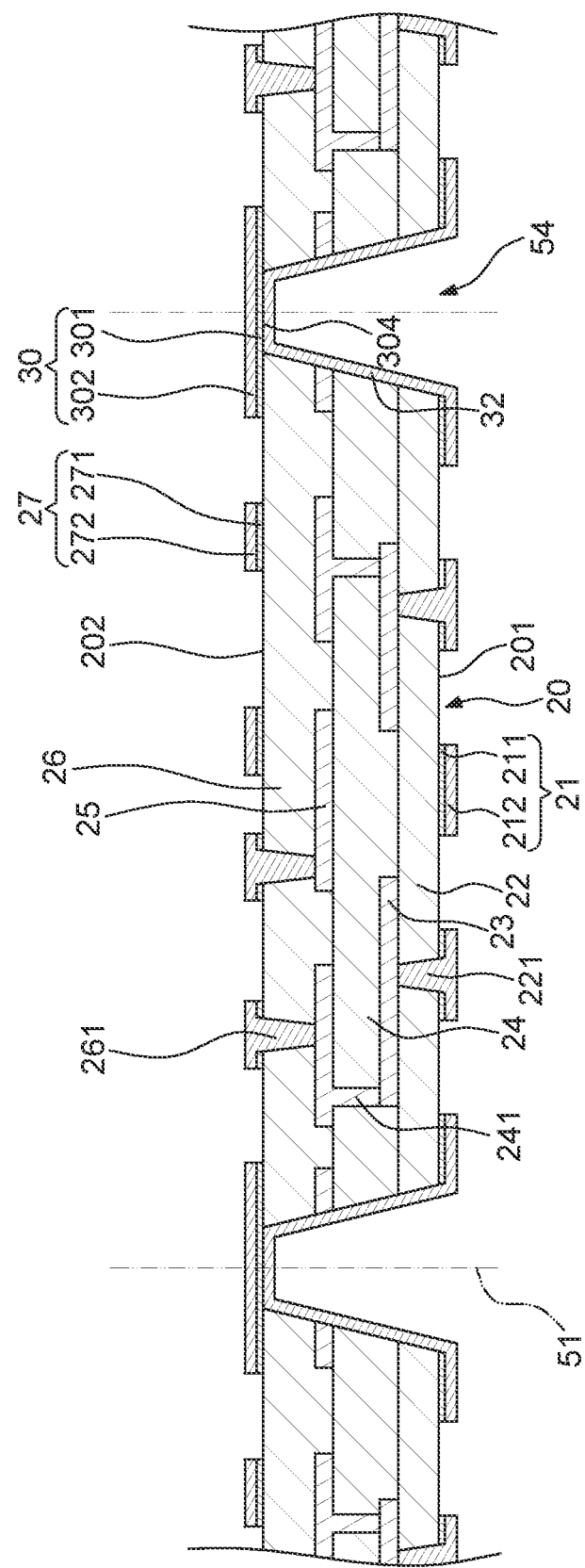
FIG. 20 illustrates one or more stages of an example of a method for manufacturing a semiconductor package according to some embodiments of the present disclosure.

Referring to FIG. 18, at least one first hole 52, at least one second hole 54 and at least one third hole 56 are formed by, for example, laser drilling. The first hole 52 extends through the first metal layer 211 and the first dielectric structure 22, and is stopped by the second circuitry structure 23 so as to expose a portion of the second circuitry structure 23. As shown in FIG. 18, the first hole 52 is tapered from its bottom end to its top end. The second hole 54 extends through the first dielectric structure 22, the second dielectric structure 24, the third circuitry structure 25 and the third dielectric structure 26, and is stopped by the first metal layer 271 so as to expose a portion of the first metal layer 271. As shown in FIG. 18, the second hole 54 is tapered from its bottom end to its top end. The third hole 56 extends through the first metal layer 271 and the third dielectric structure 26, and is stopped by the third circuitry structure 25 so as to expose a portion of the third circuitry structure 25. As shown in FIG. 18, the third hole 56 is tapered from its top end to its bottom end. It is understood that the first hole 52, the second hole 54 and the third hole 56 are blind holes. The second hole 54 is disposed on the singulation lines 51. That is, the second hole 54 may across the singulation line 51, and the central axis of the second hole 54 may be disposed at the singulation line 51. The second hole 54 is a recess structure at the singulation line 51, and a position of the recess structure (e.g., the second hole 54) corresponds to a position of a portion of the first metal layer 271 of the capture land 30 (FIG. 20). That is, a portion of the base material 20 is removed to form the recess structure (e.g., the second hole 54) to expose the portion of the first metal layer 271 of capture land 30 (FIG. 20).

Figure 19:
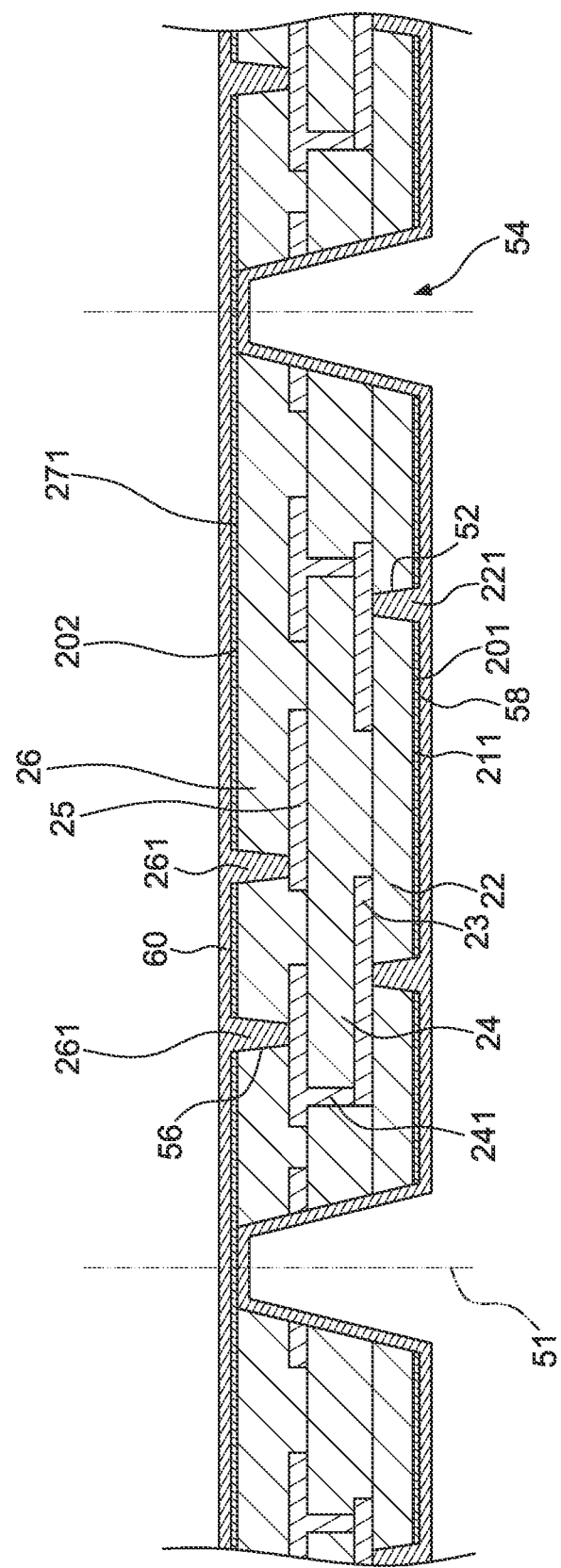
FIG. 19 illustrates one or more stages of an example of a method for manufacturing a semiconductor package according to some embodiments of the present disclosure.

Referring to FIG. 19, a bottom metal layer 58 and a top metal layer 60 are formed on the bottom side and the top side of the base material 20, respectively. In some embodiments, the bottom metal layer 58 and the top metal layer 60 may be formed concurrently by electroplating. As shown in FIG. 19, the bottom metal layer 58 covers and contacts the first metal layer 211 and the sidewalls of the first hole 52 and the second hole 54. The bottom metal layer 58 may fill the first hole 52 to form a first via structure 221, and may not fill the second hole 54. In addition, the top metal layer 60 covers and contacts the first metal layer 271 and the sidewall of the third hole 56. The top metal layer 60 may fill the third hole 56 to form a third via structure 261. It is noted that the first hole 52 and third hole 56 may be filled.

Referring to FIG. 20, the bottom metal layer 58 on the first metal layer 211 is patterned by subtractive etching to form the second metal layer 212. The top metal layer 60 on the first metal layer 271 is patterned by subtractive etching to form the second metal layer 272. Then, portions of the first metal layer 211 that are not covered by the second metal layer 212 are removed by, for example, flash etching, so as to form a first circuitry structure 21. Portions of the first metal layer 271 that are not covered by the second metal layer 272 are removed by, for example, flash etching, so as to form a fourth circuitry structure 27 and a capture land 30 on the second hole 54. Meanwhile, a portion of the first metal layer 271 on the second hole 54 is the first metal layer 301, and a portion of the second metal layer 272 on the first metal layer 301 is the second metal layer 302. The capture land 30 includes the first metal layer 301 and the second metal layer 302. Thus, the capture land 30 is a portion of the fourth circuitry structure 27, and the capture land 30 and the fourth circuitry structure 27 are formed concurrently. The capture land 30 is disposed in or on the base material 20, and the capture land 30 extends across the singulation line 51. In addition, a portion of the bottom metal layer 58 disposed in the second hole 54 is the interconnection structure 32. A portion of the interconnection structure 32 is disposed on and contacts the capture land 30, and another portion of the interconnection structure 32 extends to the bottom surface 201 of the base material 20. That is, the interconnection structure 32 is a conductive patterned structure formed along an inner lateral surface of the recess structure (e.g., the second hole 54) to connect to the capture land 30. In some embodiments, the interconnection structure 32 and the second metal layer 212 of the first circuitry structure 21 are the same layer, and are formed integrally and concurrently. Instead of a subtractive process to form the external circuit patterns, an additive process like pattern plating may be used to form the circuit pattern.

Figure 21:
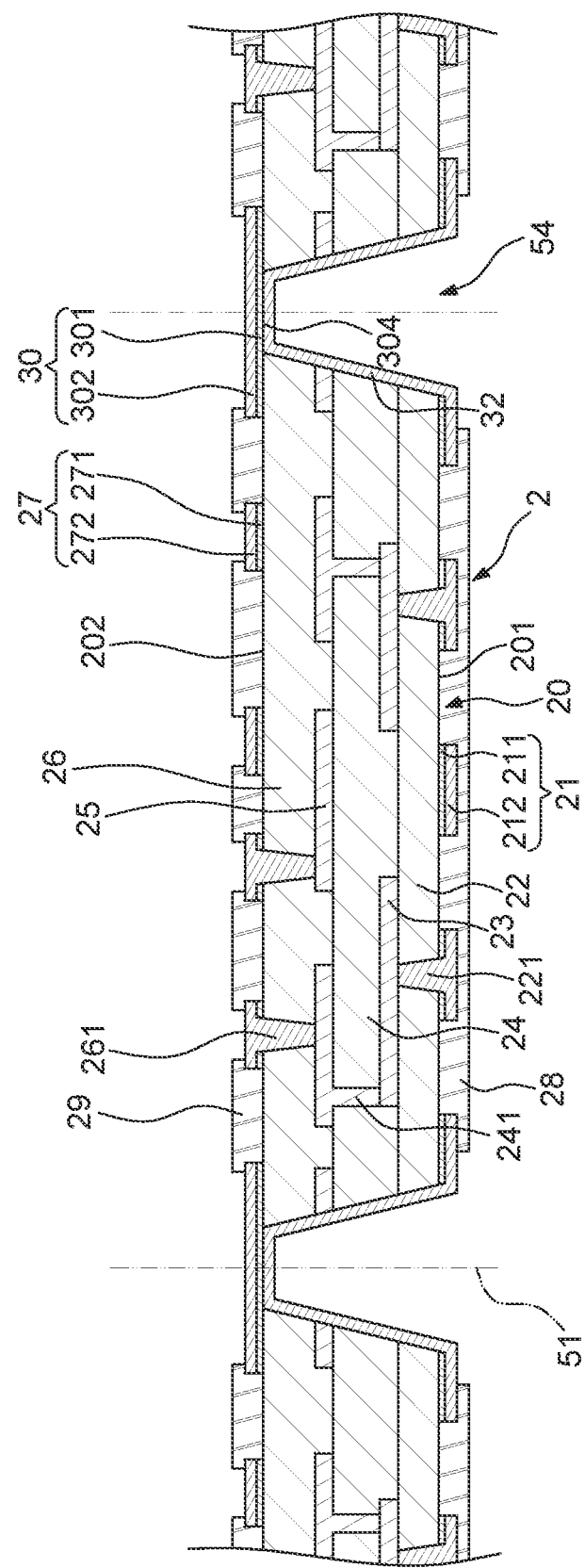
FIG. 21 illustrates one or more stages of an example of a method for manufacturing a semiconductor package according to some embodiments of the present disclosure.

Referring to FIG. 21, a first protection layer 28 is formed or disposed to cover and contact the bottom surface of the first dielectric structure 22 and at least a portion of the first circuitry structure 21. The first protection layer 28 may define at least one opening to expose a portion of the first circuitry structure 21. The first protection layer 28 may include a solder resist material, such as, for example, benzocyclobutene (BCB), epoxy, acrylate or polyimide. A second protection layer 29 is formed or disposed to cover and contact the top surface of the third dielectric structure 26 and at least a portion of the fourth circuitry structure 27. The second protection layer 29 may define at least one opening to expose a portion of the fourth circuitry structure 27. The second protection layer 29 may include a solder resist material, such as, for example, benzocyclobutene (BCB), epoxy, acrylate or polyimide. Meanwhile, a substrate 2 is formed. The substrate 2 includes the base material 20, the capture land 30, the interconnection structure 32, the first protection layer 28 and the second protection layer 29.

Figure 22:
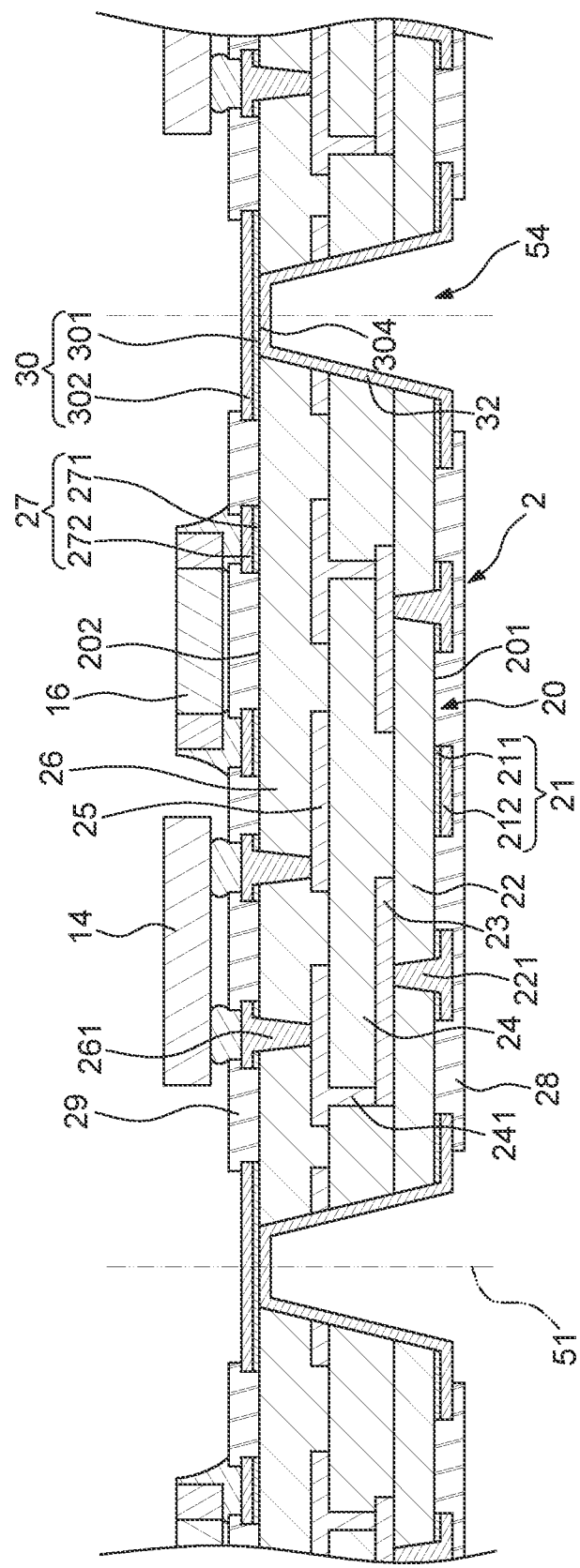
FIG. 22 illustrates one or more stages of an example of a method for manufacturing a semiconductor package according to some embodiments of the present disclosure.

Referring to FIG. 22, at least one semiconductor chip 14 and at least one passive device 16 are disposed adjacent to the top surface 202 of the base material 20. As shown in FIG. 22, the semiconductor chip 14 and the passive device 16 are disposed on and electrically connected the fourth circuitry structure 27 on the top surface 202 of the base material 20 of the substrate 2. For example, the semiconductor chip 14 is bonded to the base material 20 by flip chip bonding, and the passive device 16 is bonded to the base material 20 by surface mounting technique (SMT).

Figure 23:
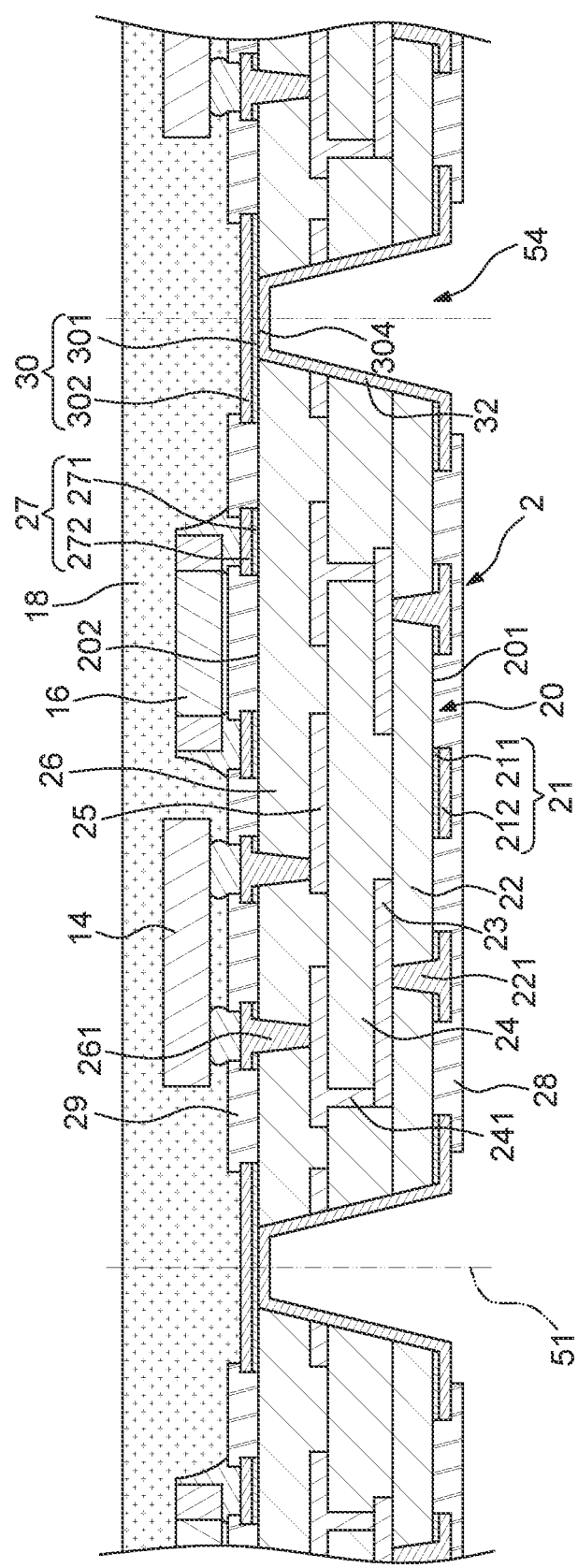
FIG. 23 illustrates one or more stages of an example of a method for manufacturing a semiconductor package according to some embodiments of the present disclosure.

Referring to FIG. 23, an encapsulant 18, for example, molding compound, is formed or disposed adjacent to the top surface 202 of the base material 20 to cover the semiconductor chip 14, the passive device 16 and the substrate 2. As shown in FIG. 23, the encapsulant 18 covers and contacts the semiconductor chip 14, the passive device 16, the second protection layer 29 and the capture land 30. Since the top end of the interconnection structure 32 is formed on the capture land 30, the encapsulant 18 can be formed by molding process. In other words, the capture land 30 and the top end of the interconnection structure 32 can prevent the encapsulant 18 from entering the second hole 54 during the molding process.

Figure 24:
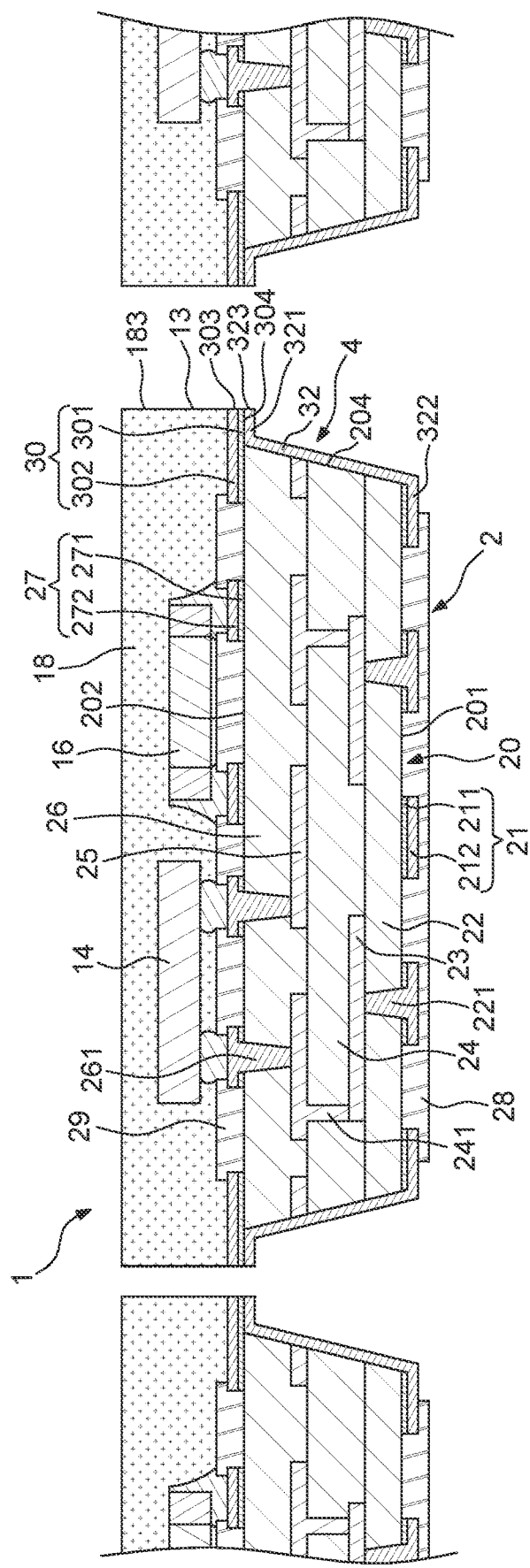
FIG. 24 illustrates one or more stages of an example of a method for manufacturing a semiconductor package according to some embodiments of the present disclosure.

Referring to FIG. 24, a singulation process is conducted form a plurality of semiconductor packages 1 as shown in FIG. 1 to FIG. 4. The encapsulant 18 and the substrate 2 are singulated along the singulation line 51 by a saw blade or a laser beam. During the singulation process, the interconnection structure 32 is covered by the capture land 30 and the encapsulant 18, thus the interconnection structure 32 will not be ripped from the base material 20. Thus, the yield rate of the semiconductor package 1 can be improved.

Figure 25:
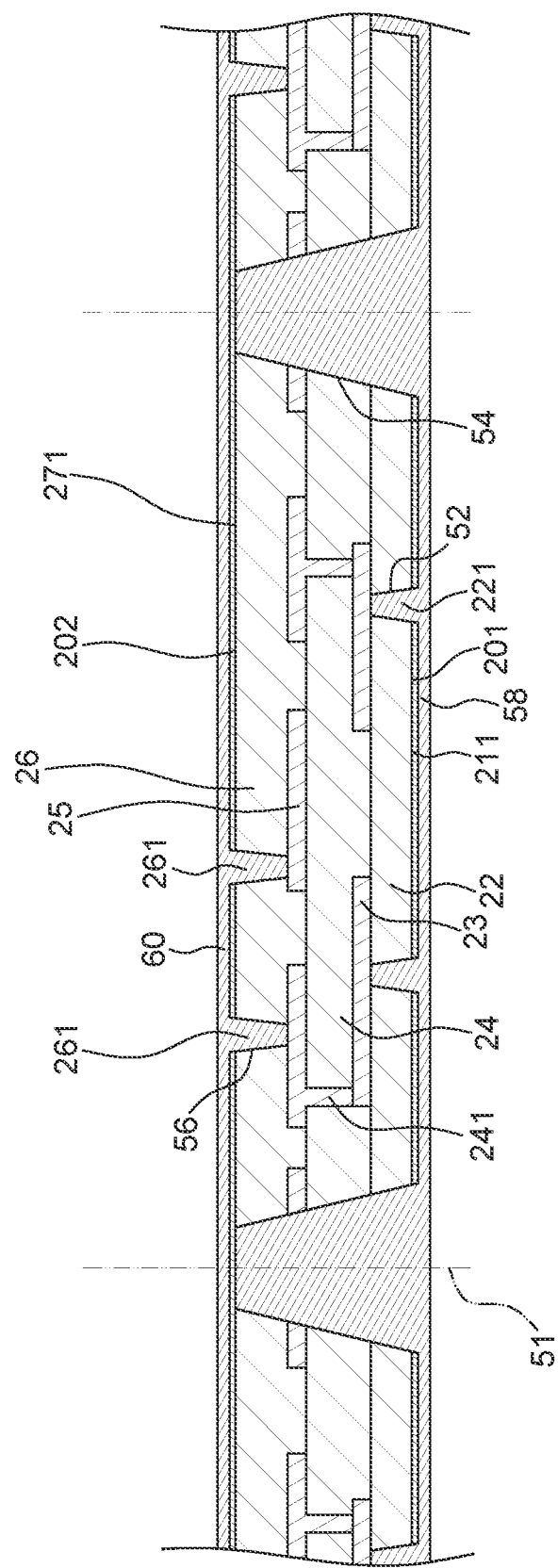
FIG. 25 illustrates one or more stages of an example of a method for manufacturing a semiconductor package according to some embodiments of the present disclosure.

FIG. 25 illustrates a method for manufacturing a semiconductor package according to some embodiments of the present disclosure. In some embodiments, the method is for manufacturing a semiconductor package such as the semiconductor package 1a shown in FIG. 5 to FIG. 6. The initial stages of the illustrated process are the same as, or similar to, the stages illustrated in FIG. 17 through FIG. 18. FIG. 25 depicts a stage subsequent to that depicted in FIG. 18.

Referring to FIG. 25, the bottom metal layer 58 fills the second hole 54.

The stages subsequent to that shown in FIG. 25 of the illustrated process are similar to the stages illustrated in FIG. 20 through FIG. 24, thus forming the semiconductor package 1a shown in FIG. 5 and FIG. 6.

Figure 26:
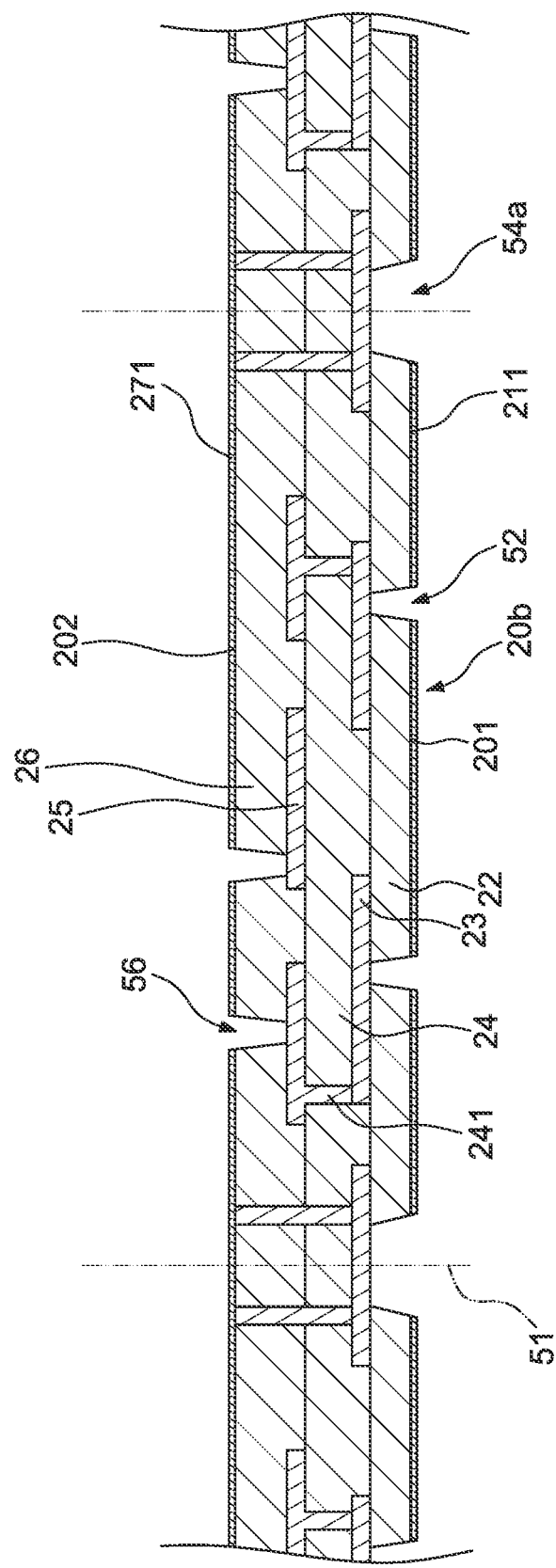
FIG. 26 illustrates one or more stages of an example of a method for manufacturing a semiconductor package according to some embodiments of the present disclosure.

FIG. 26 illustrates a method for manufacturing a semiconductor package according to some embodiments of the present disclosure. In some embodiments, the method is for manufacturing a semiconductor package such as the semiconductor package 1b shown in FIG. 7 to FIG. 8. The initial stage of the illustrated process is the same as, or similar to, the stage illustrated in FIG. 17. FIG. 26 depicts a stage subsequent to that depicted in FIG. 17.

Referring to FIG. 26, the first hole 52, at least one second hole 54a and the third hole 56 are formed by, for example, laser drilling. The first hole 52 and the second hole 54a extend through the first metal layer 211 and the first dielectric structure 22, and are stopped by the second circuitry structure 23 so as to expose a portion of the second circuitry structure 23. As shown in FIG. 26, the first hole 52 is tapered from its bottom end to its top end, and the second hole 54a is also tapered from its bottom end to its top end. The third hole 56 extends through the first metal layer 271 and the third dielectric structure 26, and is stopped by the third circuitry structure 25 so as to expose a portion of the third circuitry structure 25. As shown in FIG. 26, the third hole 56 is tapered from its top end to its bottom end. It is understood that the first hole 52, the second hole 54 and the third hole 56 are blind holes. The second hole 54a is disposed on the singulation lines 51. That is, the second hole 54a may across the singulation line 51, and the central axis of the second hole 54a may be disposed at the singulation line 51. The second hole 54a is a recess structure at the singulation line 51, and a position of the recess structure (e.g., the second hole 54a) corresponds to a position of a portion of the second circuitry structure 23 of the capture land 30a (FIG. 7). It is noted that the second hole 54a may also be extended to the third circuitry structure 25 to connect to an appropriate pad there as an alternative structure.

The stages subsequent to that shown in FIG. 26 of the illustrated process are similar to the stages illustrated in FIG. 19 through FIG. 24, thus forming the semiconductor package 1b shown in FIG. 7 and FIG. 8. It is understood that, after the singulation process, the one-half of the second hole 54a is the indentation structure 4a of the substrate 2b of FIG. 7, and the bottom metal layer 58 in the indentation structure 4a is the interconnection structure 32b of FIG. 7.

Figure 27:
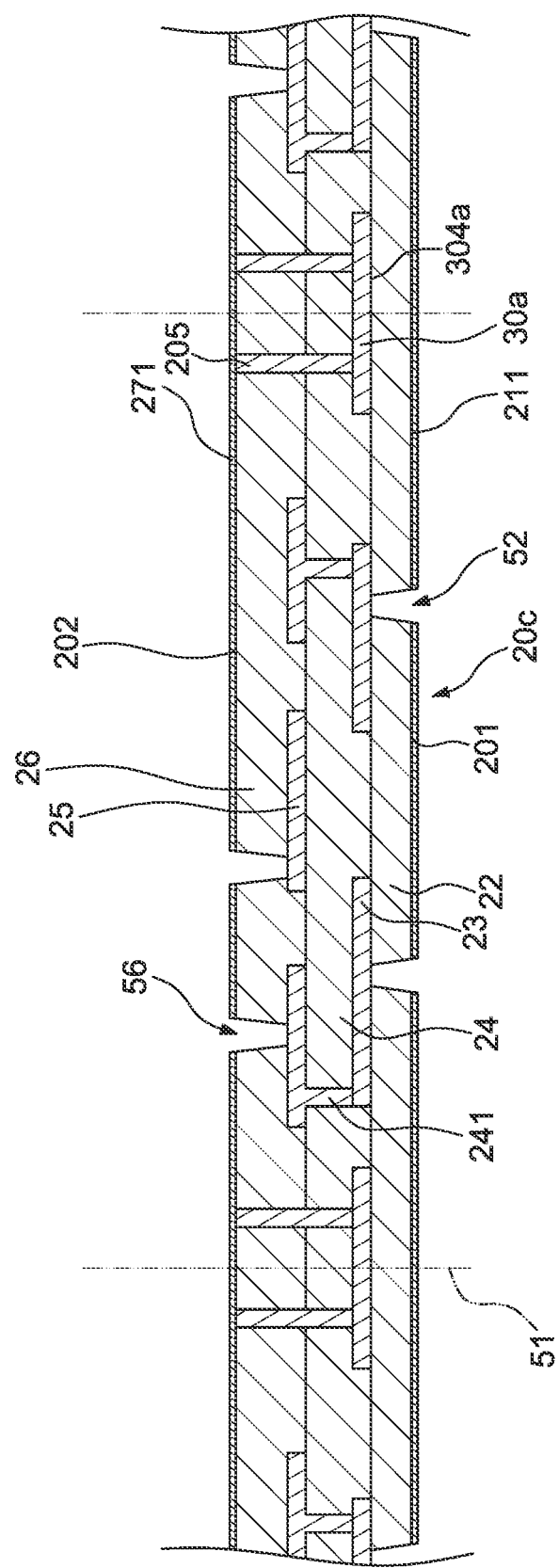
FIG. 27 illustrates one or more stages of an example of a method for manufacturing a semiconductor package according to some embodiments of the present disclosure.
Figure 28:
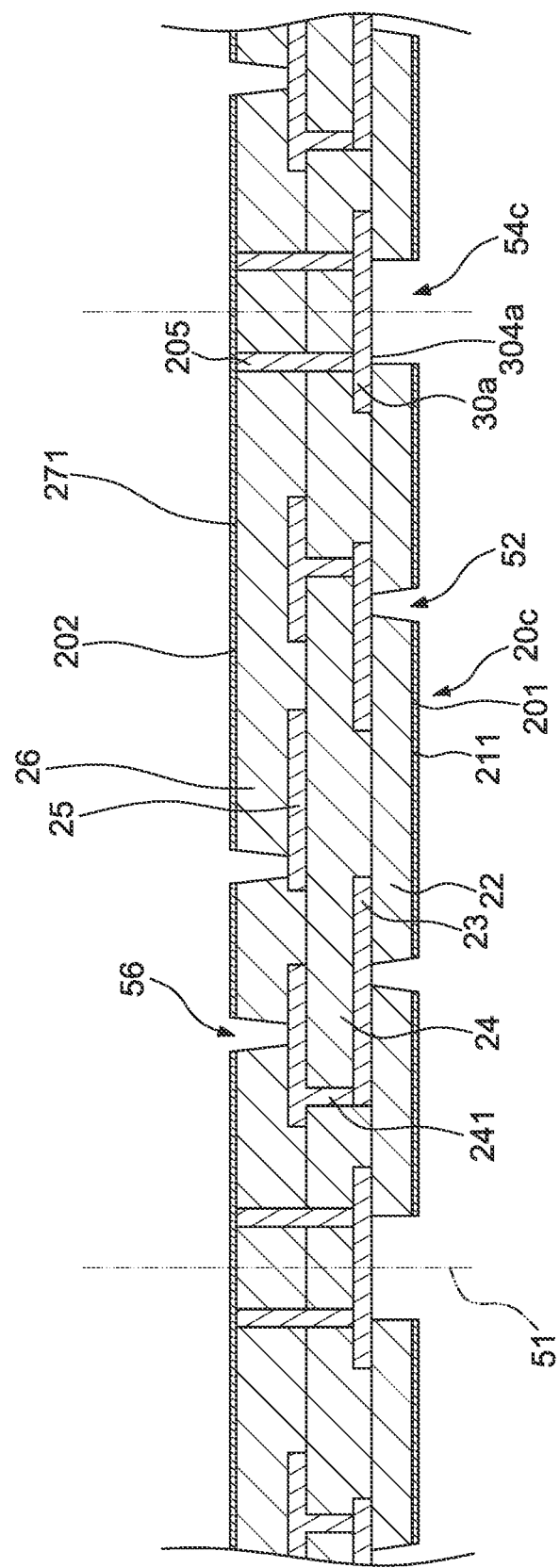
FIG. 28 illustrates one or more stages of an example of a method for manufacturing a semiconductor package according to some embodiments of the present disclosure.
Figure 29:
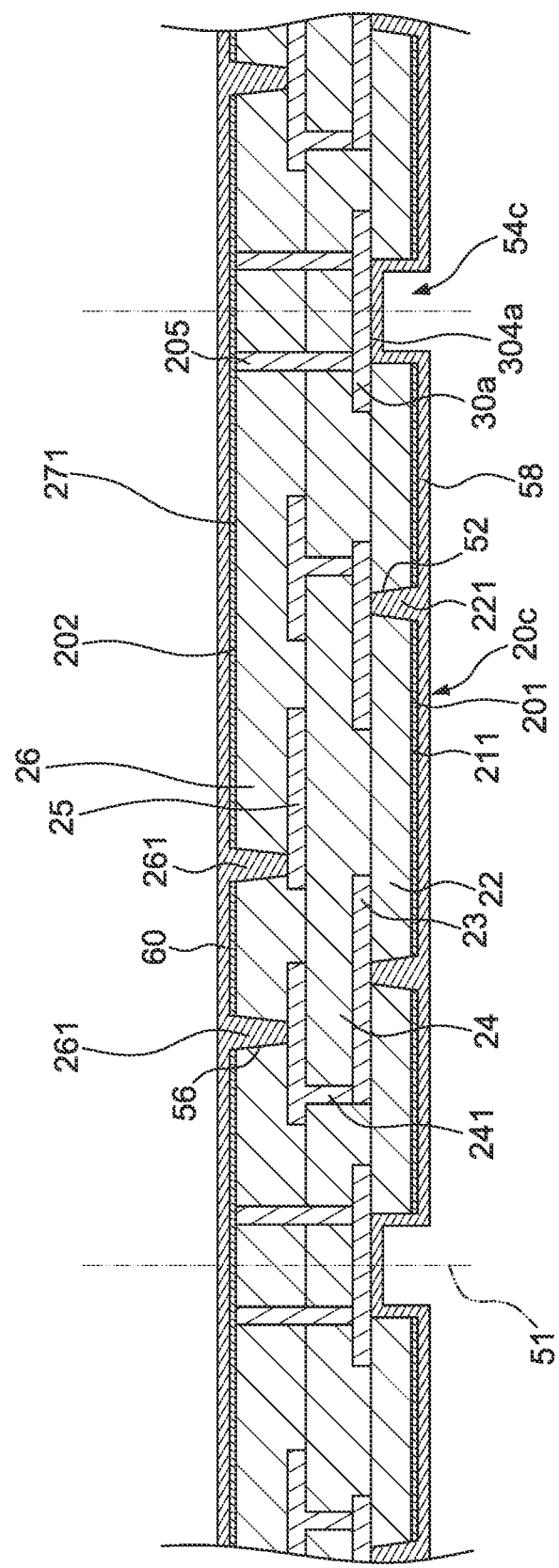
FIG. 29 illustrates one or more stages of an example of a method for manufacturing a semiconductor package according to some embodiments of the present disclosure.

FIG. 27 through FIG. 29 illustrate a method for manufacturing a semiconductor package according to some embodiments of the present disclosure. In some embodiments, the method is for manufacturing a semiconductor package such as the semiconductor package 1c shown in FIG. 9 to FIG. 10. The initial stage of the illustrated process is the same as, or similar to, the stage illustrated in FIG. 17. FIG. 27 depicts a stage subsequent to that depicted in FIG. 17.

Referring to FIG. 27, the first hole 52 and the third hole 56 are formed by, for example, laser drilling. The first hole 52 extends through the first metal layer 211 and the first dielectric structure 22, and is stopped by the second circuitry structure 23 so as to expose a portion of the second circuitry structure 23. As shown in FIG. 27, the first hole 52 is tapered from its bottom end to its top end. The third hole 56 extends through the first metal layer 271 and the third dielectric structure 26, and is stopped by the third circuitry structure 25 so as to expose a portion of the third circuitry structure 25. As shown in FIG. 27, the third hole 56 is tapered from its top end to its bottom end. It is understood that the first hole 52 and the third hole 56 are blind holes.

Referring to FIG. 28, at least one second hole 54c is formed by, for example, blade sawing, exposure and development, or laser drilling. The second hole 54c extends through the first metal layer 211 and the first dielectric structure 22, and is stopped by the second circuitry structure 23 so as to expose a portion of the second circuitry structure 23. As shown in FIG. 28, the second hole 54c is not a tapered structure. The sidewall of the second hole 54c is substantially perpendicular to the bottom surface 201 of the base material 20c and the bottom surface 304a of the capture land 30a. It is understood that the second hole 54c is a blind hole. The second hole 54c is disposed on the singulation lines 51. That is, the second hole 54c may across the singulation line 51, and the central axis of the second hole 54c may be disposed at the singulation line 51. The second hole 54c is a recess structure at the singulation line 51, and a position of the recess structure (e.g., the second hole 54c) corresponds to a position of a portion of the second circuitry structure 23 of the capture land 30a.

Referring to FIG. 29, a bottom metal layer 58 and a top metal layer 60 are formed on the bottom side and the top side of the base material 20c, respectively. In some embodiments, the bottom metal layer 58 and the top metal layer 60 may be formed concurrently by electroplating. As shown in FIG. 29, the bottom metal layer 58 covers and contacts the first metal layer 211 and the sidewalls of the first hole 52 and the second hole 54c. The bottom metal layer 58 may full the first hole 52 to form a first via structure 221, and may not full the second hole 54c. In addition, the top metal layer 60 covers and contacts the first metal layer 271 and the sidewall of the third hole 56. The top metal layer 60 may full the third hole 56 to form a third via structure 261. As an alternative, the second hole 54c may be extended to an appropriate land of the third circuitry structure 25 to yield an alternative castellated substrate.

The stages subsequent to that shown in FIG. 29 of the illustrated process are similar to the stages illustrated in FIG. 20 through FIG. 24, thus forming the semiconductor package 1c shown in FIG. 9 and FIG. 10.

It is understood that, after the singulation process, the one-half of the second hole 54c is the indentation structure 4b of the substrate 2c of FIG. 9, and the bottom metal layer 58 in the indentation structure 4b is the interconnection structure 32b of FIG. 9.

Figure 30:
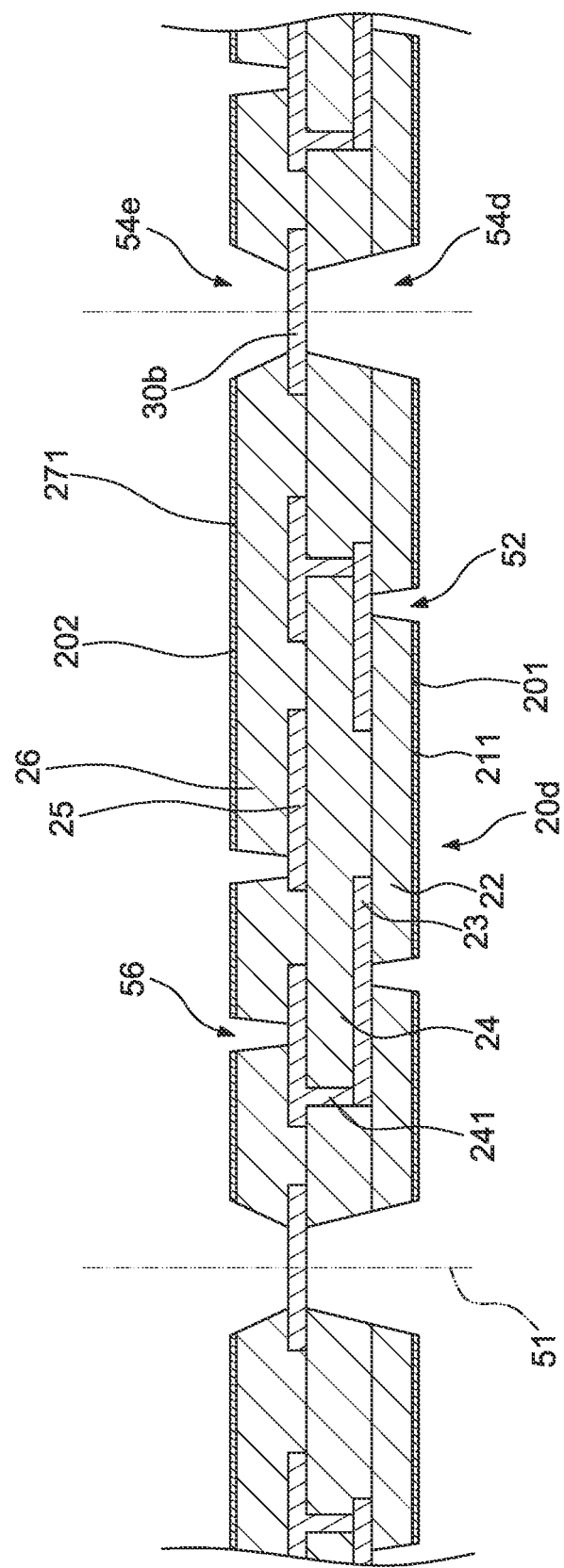
FIG. 30 illustrates one or more stages of an example of a method for manufacturing a semiconductor package according to some embodiments of the present disclosure.
Figure 31:
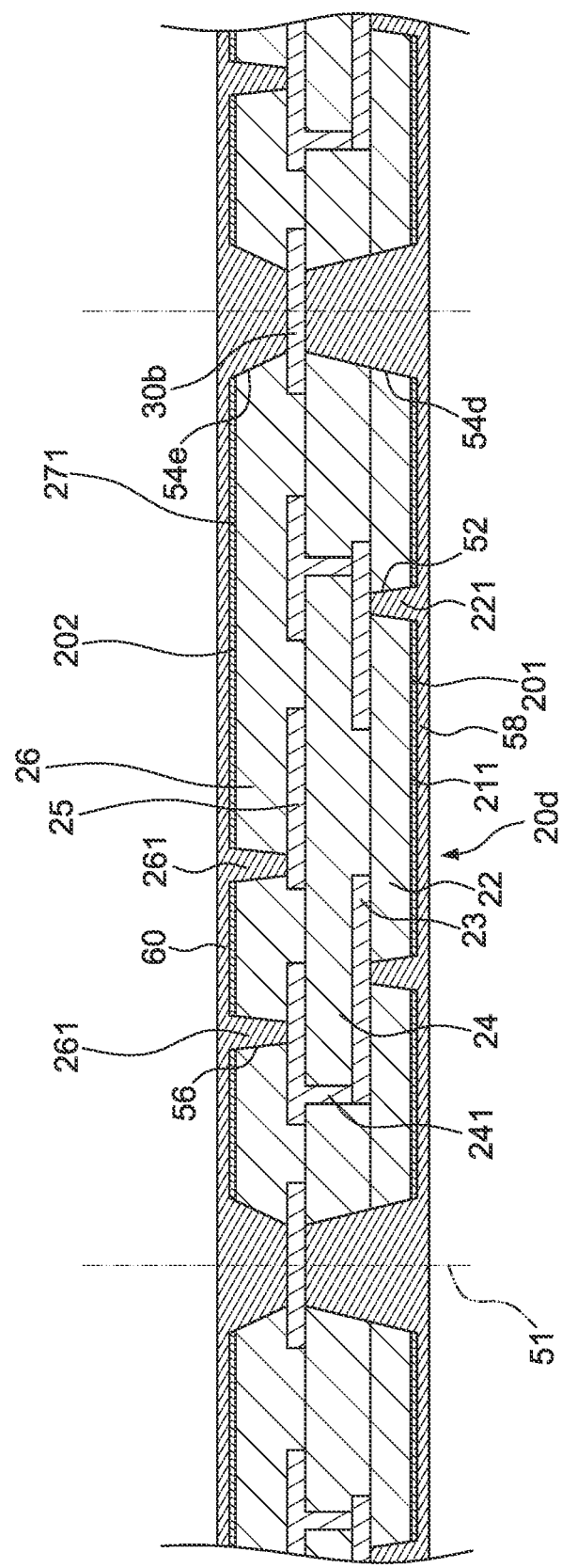
FIG. 31 illustrates one or more stages of an example of a method for manufacturing a semiconductor package according to some embodiments of the present disclosure.

FIG. 30 through FIG. 31 illustrate a method for manufacturing a semiconductor package according to some embodiments of the present disclosure. In some embodiments, the method is for manufacturing a semiconductor package such as the semiconductor package 1d shown in FIG. 11 to FIG. 12. The initial stage of the illustrated process is the same as, or similar to, the stage illustrated in FIG. 17. FIG. 30 depicts a stage subsequent to that depicted in FIG. 17.

Referring to FIG. 30, the first hole 52, at least one second lower hole 54d, at least one second upper hole 54e and the third hole 56, are formed by, for example, laser drilling. The first hole 52 extends through the first metal layer 211 and the first dielectric structure 22, and is stopped by the second circuitry structure 23 so as to expose a portion of the second circuitry structure 23. As shown in FIG. 30, the first hole 52 is tapered from its bottom end to its top end. The second lower hole 54d extends through the first metal layer 211, the first dielectric structure 22 and the second dielectric structure 24, and is stopped by the third circuitry structure 25 (e.g., the capture land 30b) so as to expose a bottom portion of the third circuitry structure 25. As shown in FIG. 30, the second lower hole 54d is tapered from its bottom end to its top end. The second upper hole 54e extends through the first metal layer 271 and the third dielectric structure 26, and is stopped by the third circuitry structure 25 (e.g., the capture land 30b) so as to expose a top portion of the third circuitry structure 25 (e.g., the capture land 30b). As shown in FIG. 30, the second upper hole 54e is tapered from its top end to its bottom end. The third hole 56 extends through the first metal layer 271 and the third dielectric structure 26, and is stopped by the third circuitry structure 25 so as to expose a top portion of the third circuitry structure 25. As shown in FIG. 30, the third hole 56 is tapered from its top end to its bottom end. It is understood that the first hole 52, the second lower hole 54d, the second upper hole 54e and the third hole 56 are blind holes. The second upper hole 54e is disposed right above the second lower hole 54d.

Referring to FIG. 31, a bottom metal layer 58 and a top metal layer 60 are formed on the bottom side and the top side of the base material 20d, respectively. In some embodiments, the bottom metal layer 58 and the top metal layer 60 may be formed concurrently by electroplating. As shown in FIG. 31, the bottom metal layer 58 covers and contacts the first metal layer 211 and the sidewalls of the first hole 52 and the second lower hole 54d. The bottom metal layer 58 may full the first hole 52 to form a first via structure 221, and may also fill the second lower hole 54d to form a lower interconnection structure 32c. In addition, the top metal layer 60 covers and contacts the first metal layer 271 and the sidewalls of the second upper hole 54e and the third hole 56. The top metal layer 60 may fill the third hole 56 to form a third via structure 261, and may also fill the second upper hole 54e to form an upper interconnection structure 32d. Alternatively, the capture land 30b may be drilled through and subsequently filled in simultaneously during plating as an alternative via structure, a so called x-via.

The stages subsequent to that shown in FIG. 31 of the illustrated process are similar to the stages illustrated in FIG. 20 through FIG. 24, thus forming the semiconductor package 1d shown in FIG. 11 and FIG. 12.

It is understood that, after the singulation process, the one-half of the lower interconnection structure 32c is the lower interconnection structure 32c of FIG. 11, and the one-half of the upper interconnection structure 32d is the upper interconnection structure 32d of FIG. 11.

Figure 32:
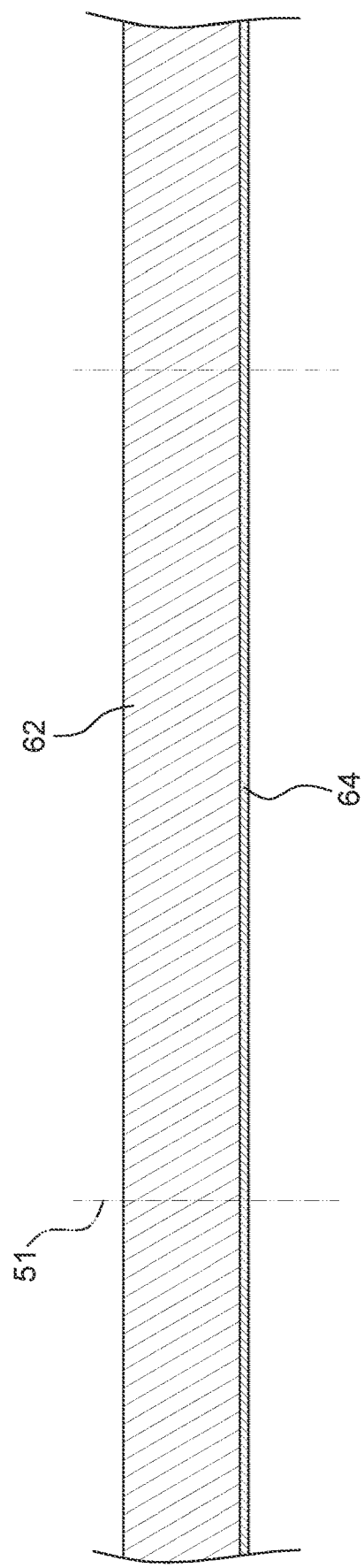
FIG. 32 illustrates one or more stages of an example of a method for manufacturing a semiconductor package according to some embodiments of the present disclosure.

FIG. 32 through FIG. 39 illustrate a method for manufacturing a semiconductor package according to some embodiments of the present disclosure. In some embodiments, the method is for manufacturing a semiconductor package such as the semiconductor package 1e shown in FIG. 13 to FIG. 14. Referring to FIG. 32, a carrier 62 with a metal layer 64 is provided. The carrier 62 may be, for example, a metal material, a ceramic material, a glass material, a substrate or a semiconductor wafer. In some embodiments, the metal layer 64 may be a copper foil that is formed or disposed on a surface of the carrier 62.

Figure 33:
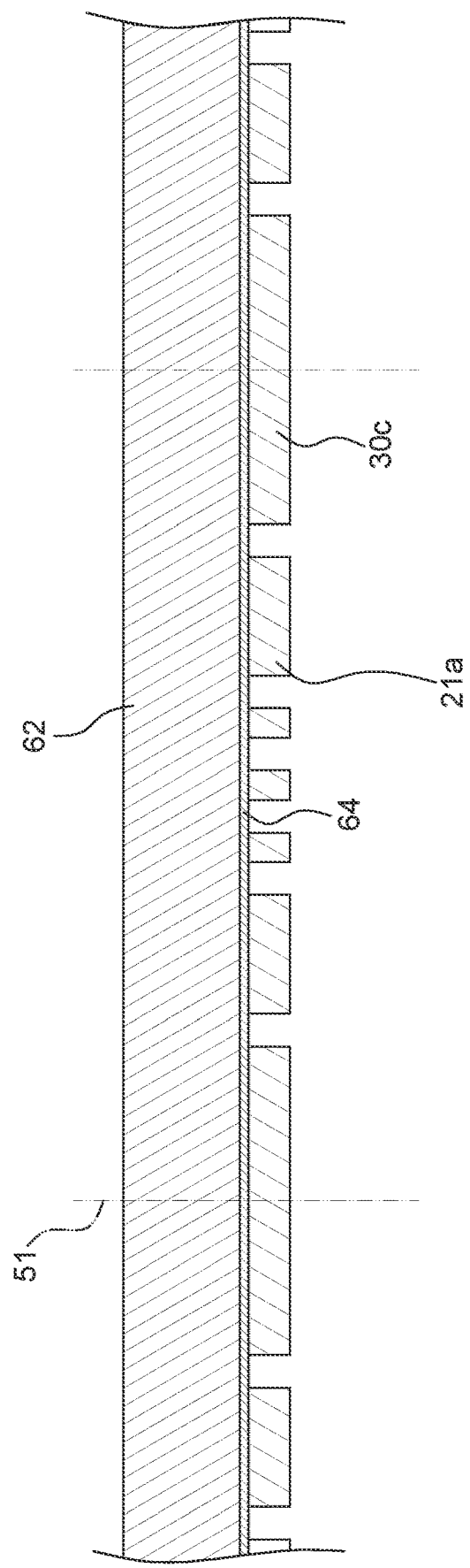
FIG. 33 illustrates one or more stages of an example of a method for manufacturing a semiconductor package according to some embodiments of the present disclosure.

Referring to FIG. 33, a first circuitry structure 21a and a capture land 30c are formed or built up on the metal layer 64 on the carrier 62. In some embodiments, the capture land 30c is a portion of the first circuitry structure 21a, or the capture land 30c and the first circuitry structure 21a are formed integrally and concurrently. The first circuitry structure 21a may be a redistribution layer (RDL), and may include a plurality of conductive traces and/or a plurality of bonding pads.

Figure 34:
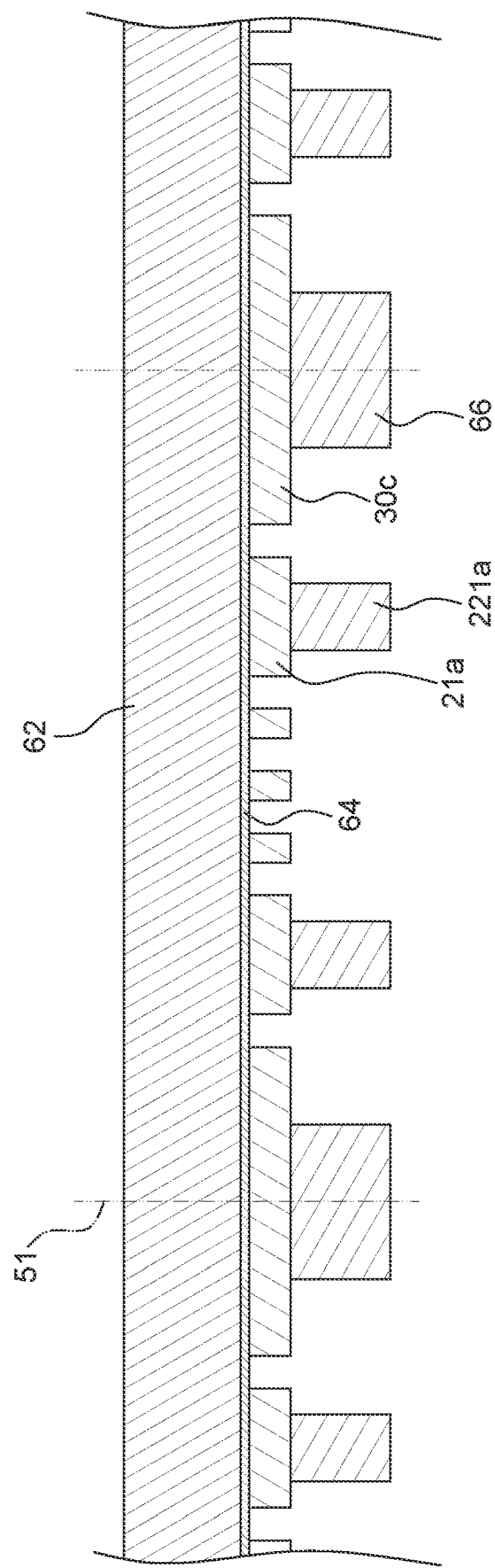
FIG. 34 illustrates one or more stages of an example of a method for manufacturing a semiconductor package according to some embodiments of the present disclosure.

Referring to FIG. 34, at least one first via structure 221a and at least one metal pillar 66 are formed or disposed on the first circuitry structure 21a by, for example, electroplating. The first via structure 221a is formed on the bonding pad of the first circuitry structure 21a, and the metal pillar 66 is formed on the capture land 30c.

Figure 35:
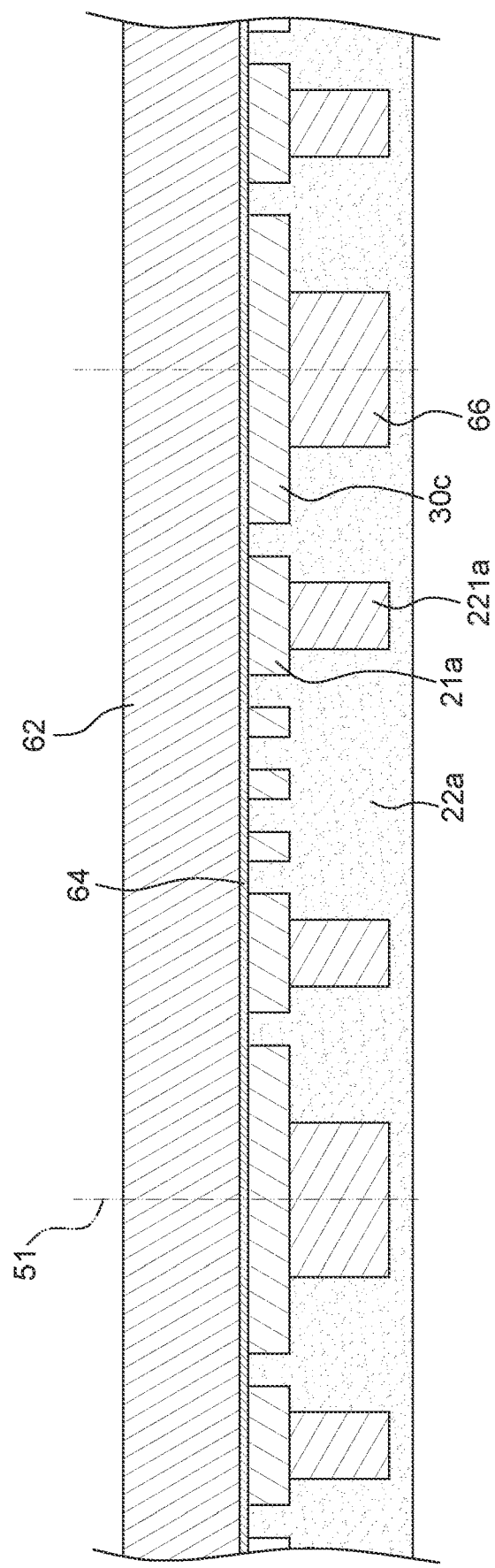
FIG. 35 illustrates one or more stages of an example of a method for manufacturing a semiconductor package according to some embodiments of the present disclosure.

Referring to FIG. 35, a first dielectric structure 22a is formed or disposed to cover the metal layer 64, the first circuitry structure 21a, the first via structure 221a and the metal pillar 66 by, for example, molding or lamination. The first dielectric structure 22a may be a molding compound, a dielectric layer or a passivation layer and may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof. In one or more embodiments, the first dielectric structure 22a may include, or be formed from a dry film type material that includes a resin and a plurality of fillers. In another embodiment, the first dielectric structure 22a may include, or be formed from a liquid type material that includes a homogeneous resin without fillers.

Figure 36:
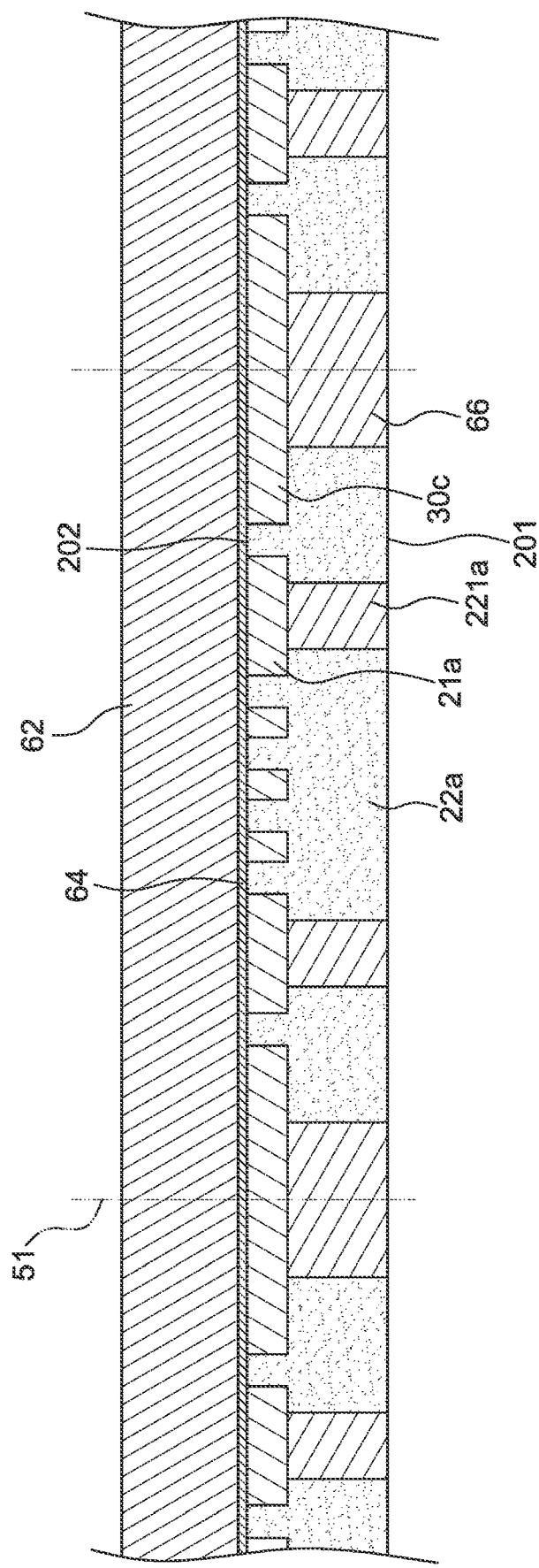
FIG. 36 illustrates one or more stages of an example of a method for manufacturing a semiconductor package according to some embodiments of the present disclosure.

Referring to FIG. 36, a top portion of the first dielectric structure 22a is removed by, for example, grinding. Thus, the first dielectric structure 22a is thinned, and one end of the first via structure 221a and one end of the metal pillar 66 are exposed from the bottom surface of the first dielectric structure 22a.

Figure 37:
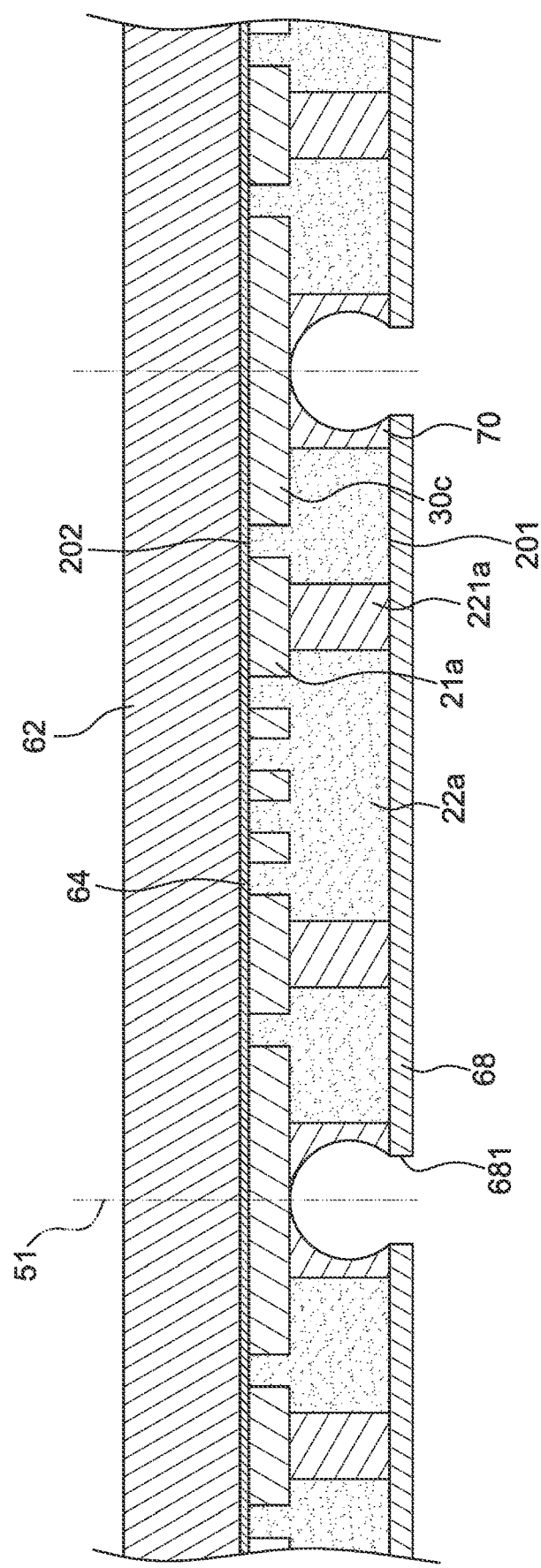
FIG. 37 illustrates one or more stages of an example of a method for manufacturing a semiconductor package according to some embodiments of the present disclosure.

Referring to FIG. 37, a dry film 68 is formed or disposed on the bottom surface of the first dielectric structure 22a to cover the first via structure 221a and the metal pillar 66. Then, at least one opening 681 is formed in the dry film 68 by, for example, photolithography process (e.g., including exposure and development) so as to expose the metal pillar 66. Then, a portion of the metal pillar 66 corresponding to the opening 681 is etched so as to form a recess structure 70.

Figure 38:
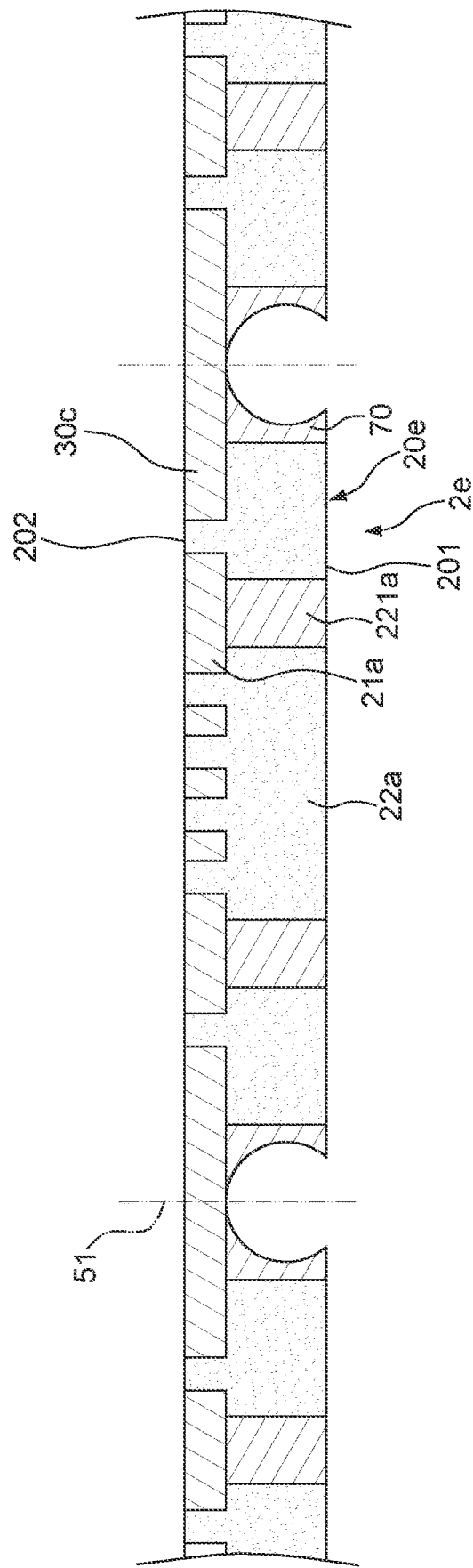
FIG. 38 illustrates one or more stages of an example of a method for manufacturing a semiconductor package according to some embodiments of the present disclosure.

Referring to FIG. 38, the dry film 68 is removed by, for example, stripping. Then, the carrier 62 is removed. Then, the metal layer 64 is removed by, for example, etching. Meanwhile, a substrate 2e is obtained. The substrate 2e has a plurality of singulation lines 51. The recess structure 70 is disposed at the singulation line 51, and the position of the recess structure 70 corresponds to the position of the capture land 30c.

Figure 39:
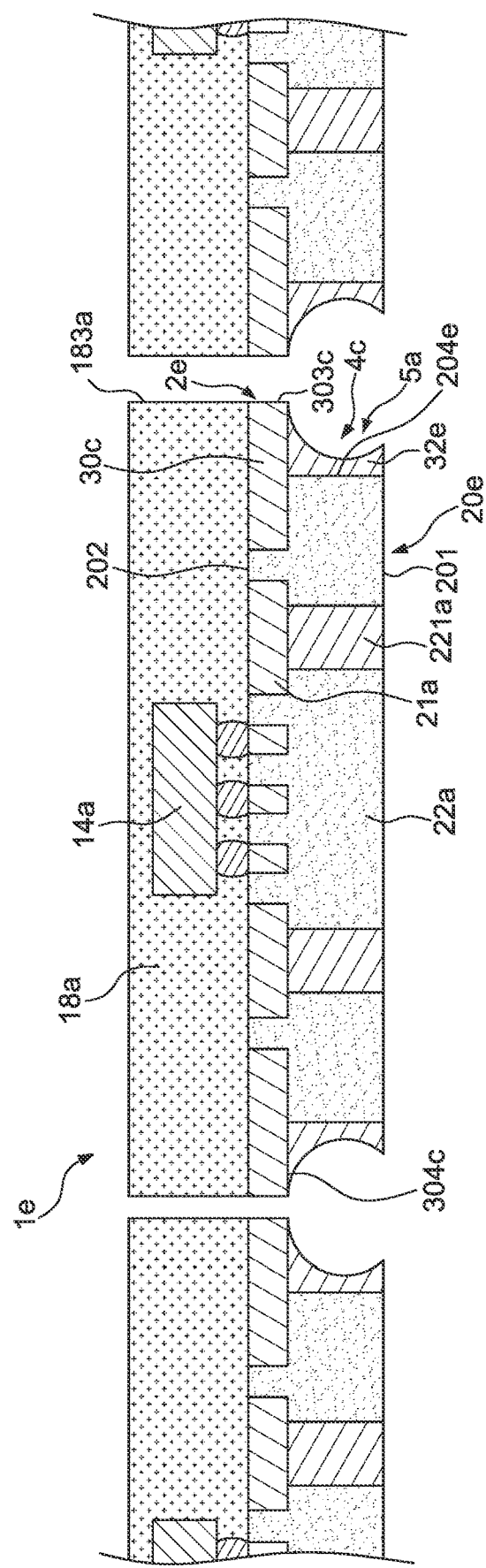
FIG. 39 illustrates one or more stages of an example of a method for manufacturing a semiconductor package according to some embodiments of the present disclosure.

Referring to FIG. 39, at least one semiconductor chip 14a is disposed on the substrate 2e. As shown in FIG. 39, the semiconductor chip 14a is disposed on and electrically connected the first circuitry structure 21a by, for example, flip chip bonding. An encapsulant 18a, for example, molding compound, is disposed adjacent to the top surface 202 of the base material 20e of the substrate 2e to cover the semiconductor chip 14a and the substrate 2e. Since the top end of the recess structure 70 is covered by the capture land 30c, the encapsulant 18a can be formed by molding process. In other words, the capture land 30c can prevent the encapsulant 18a from entering the recess structure 70 during the molding process.

Then, a singulation process is conducted form a plurality of semiconductor packages 1e as shown in FIG. 13 to FIG. 14. The encapsulant 18a and the substrate 2e are singulated along the singulation lines 51 by a saw blade or a laser beam. After the singulation process, the one half of the recess structure 70 is the interconnection structure 32e of FIG. 13. It is noted that, during the singulation process, the recess structure 70 is covered by the capture land 30c and the encapsulant 18a, thus the recess structure 70 will not be ripped from the base material 20e. Thus, the yield rate of the semiconductor package 1e can be improved.

Figure 40:
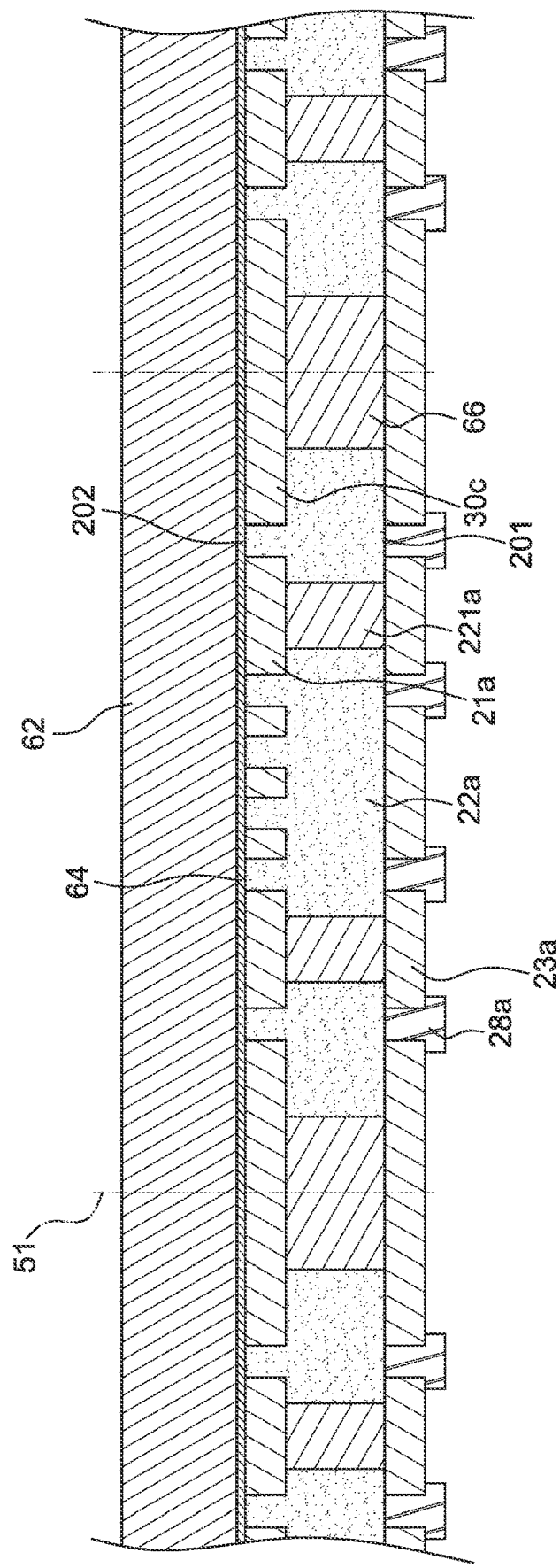
FIG. 40 illustrates one or more stages of an example of a method for manufacturing a semiconductor package according to some embodiments of the present disclosure.

FIG. 40 through FIG. 43 illustrate a method for manufacturing a semiconductor package according to some embodiments of the present disclosure. In some embodiments, the method is for manufacturing a semiconductor package such as the semiconductor package if shown in FIG. 15. The initial stages of the illustrated process are the same as, or similar to, the stages illustrated in FIG. 32 to FIG. 36. FIG. 40 depicts a stage subsequent to that depicted in FIG. 36.

Referring to FIG. 40, a second circuitry structure 23a is formed on the first dielectric structure 22a to connect to the first via structure 221a and the metal pillar 66 on the capture land 30c. The second circuitry structure 23a may be a patterned circuit layer. As shown in FIG. 40, the second circuitry structure 23a may be a redistribution layer (RDL), and is disposed on the bottom surface of the first dielectric structure 22a. Thus, the second circuitry structure 23a is electrically connected to the first circuitry structure 21a through the first via structure 221a. In some embodiments, the second circuitry structure 23a may include a plurality of conductive traces and/or a plurality of bonding pads. In one or more embodiments, an L/S of the second circuitry structure 23a may be greater than the L/S of the first circuitry structure 21a. Then, a first protection layer 28a is formed or disposed to cover and contact the bottom surface of the first dielectric structure 22a and at least a portion of the second circuitry structure 23a. The first protection layer 28a may include a solder resist material, such as, for example, benzocyclobutene (BCB) or polyimide. In some embodiments, the first protection layer 28a may define a plurality of openings to expose portions of the second circuitry structure 23a.

Figure 41:
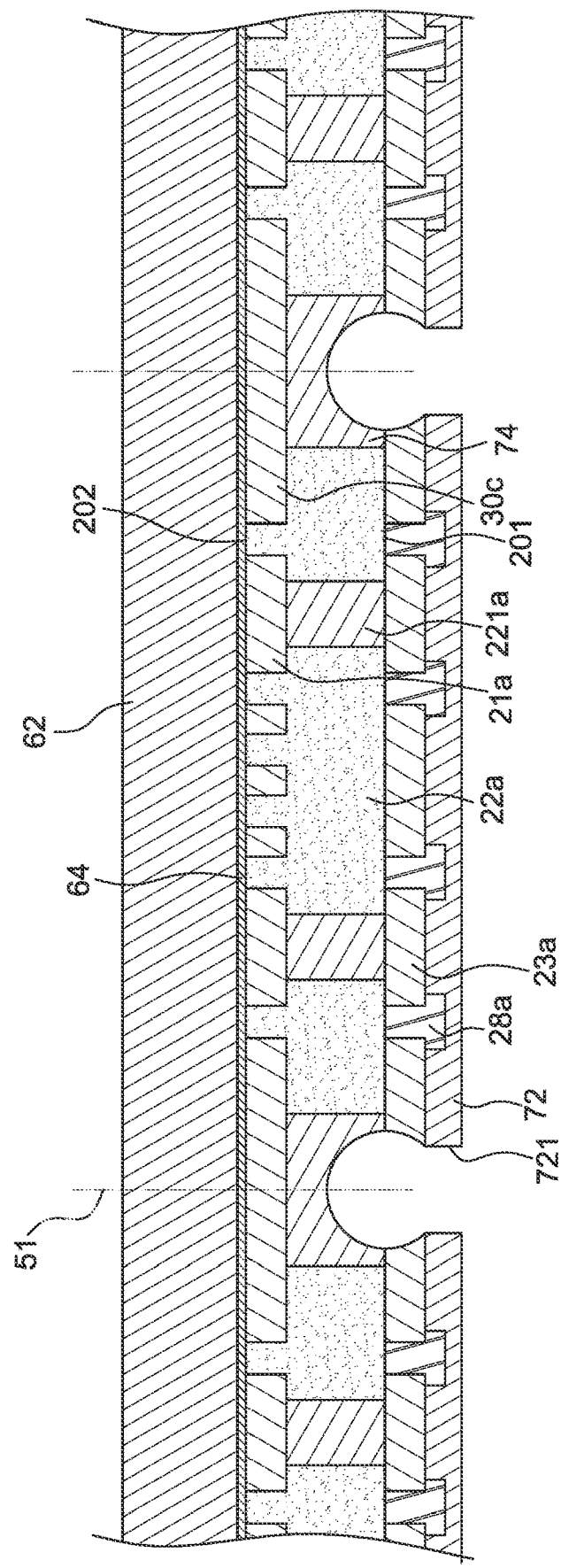
FIG. 41 illustrates one or more stages of an example of a method for manufacturing a semiconductor package according to some embodiments of the present disclosure.

Referring to FIG. 41, a dry film 72 is formed or disposed on the first protection layer 28a to cover the first protection layer 28a and the exposed portions of the second circuitry structure 23a. Then, at least one opening 721 is formed in the dry film 72 by, for example, photolithography process (e.g., including exposure and development) so as to expose a portion of the second circuitry structure 23a on the metal pillar 66. Then, a portion of the second circuitry structure 23a on the metal pillar 66 and a portion of the metal pillar 66 corresponding to the opening 721 are etched so as to form a recess structure 74.

Figure 42:
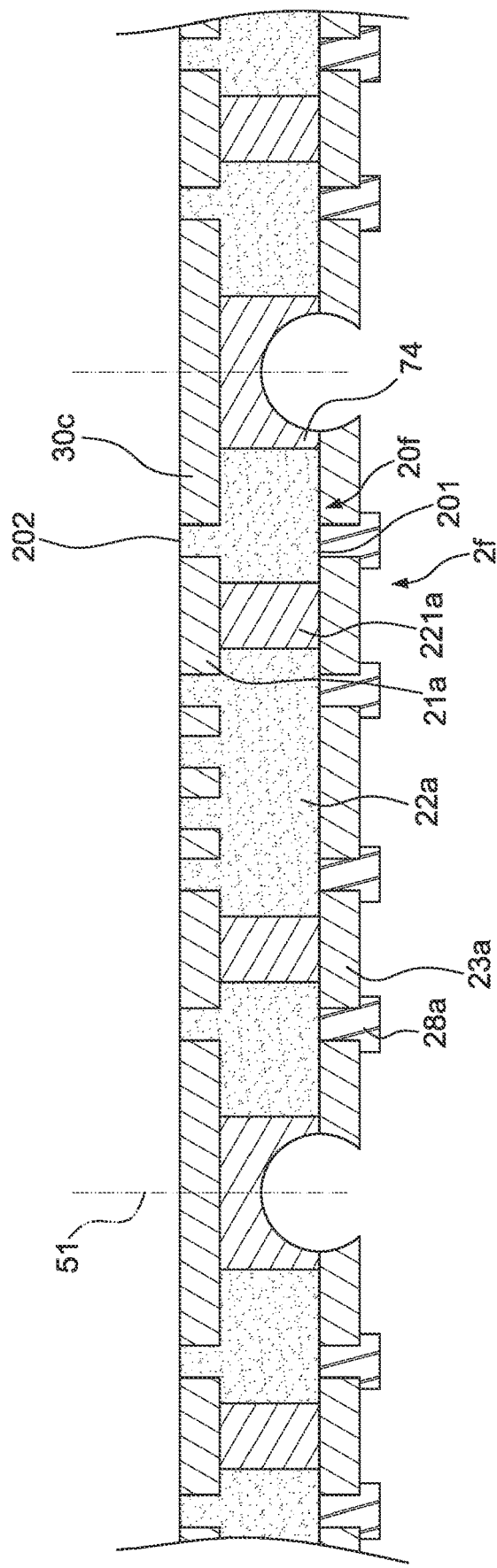
FIG. 42 illustrates one or more stages of an example of a method for manufacturing a semiconductor package according to some embodiments of the present disclosure.

Referring to FIG. 42, the dry film 72 is removed by, for example, stripping. Then, the carrier 62 is removed. Then, the metal layer 64 is removed by, for example, etching. Meanwhile, a substrate 2f is obtained. The substrate 2f has a plurality of singulation lines 51. The recess structure 74 is disposed at the singulation line 51, and the position of the recess structure 74 corresponds to the position of the capture land 30c.

Figure 43:
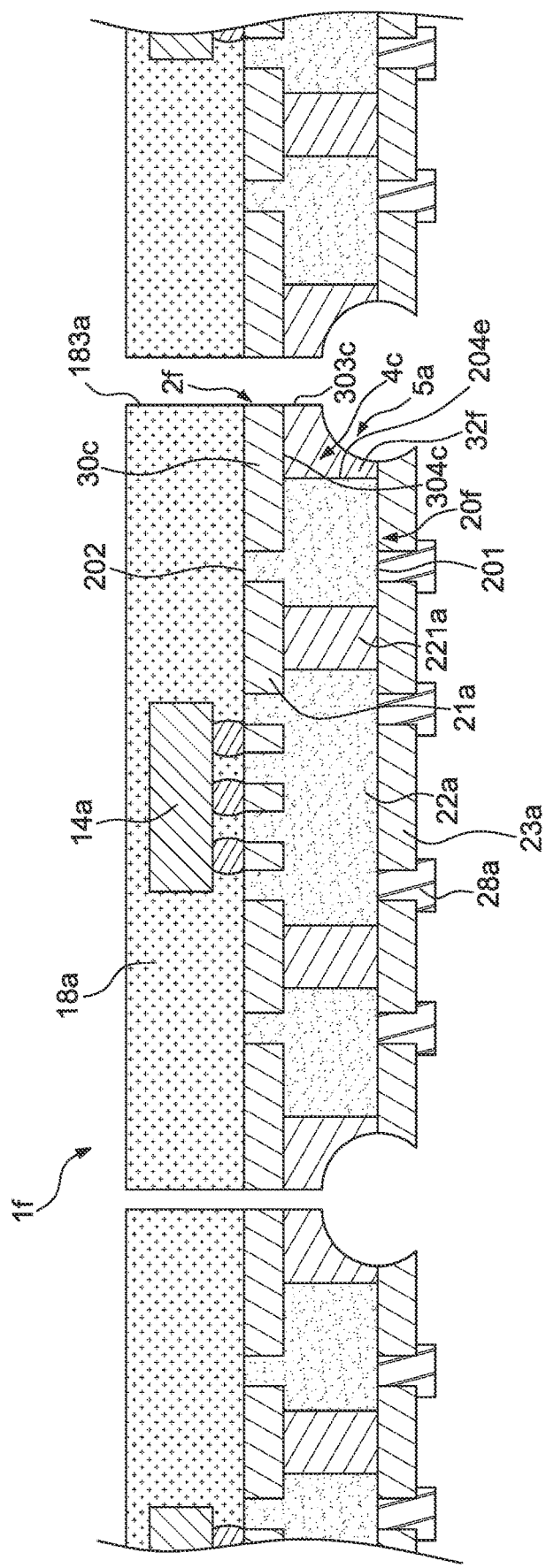
FIG. 43 illustrates one or more stages of an example of a method for manufacturing a semiconductor package according to some embodiments of the present disclosure.

Referring to FIG. 43, at least one semiconductor chip 14a is disposed on the substrate 2f. As shown in FIG. 43, the semiconductor chip 14a is disposed on and electrically connected the first circuitry structure 21a by, for example, flip chip bonding. An encapsulant 18a, for example, molding compound, is disposed adjacent to the top surface 202 of the base material 20f of the substrate 2f to cover the semiconductor chip 14a and the substrate 2f. Since the top end of the recess structure 74 is covered by the capture land 30c, the encapsulant 18a can be formed by molding process. In other words, the capture land 30c can prevent the encapsulant 18a from entering the recess structure 74 during the molding process.

Then, a singulation process is conducted form a plurality of semiconductor packages if as shown in FIG. 15. The encapsulant 18a and the substrate 2f are singulated along the singulation lines 51 by a saw blade or a laser beam. After the singulation process, the one half of the recess structure 74 is the interconnection structure 32f of FIG. 15.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate, comprising:
    a capture land;
    an interconnection structure contacting the capture land;
    a base material contacting the capture land and the interconnection structure; and
    a circuitry structure contacting the base material and electrically connected to the capture land through the interconnection structure,
    wherein the interconnection structure and the circuitry structure jointly define a recess portion, the circuitry structure has an arc-shaped surface exposed in the recess portion, and the arc-shaped surface of the circuitry structure extends downward and outward.

2. The substrate of claim 1, wherein the arc-shaped surface of the circuitry structure extends downward and outward from a top surface of the circuitry structure to a bottom surface of the circuitry structure.

3. The substrate of claim 1, wherein the circuitry structure includes a taper portion below the interconnection structure, and the taper portion of the circuitry structure tapers upward from a bottom surface of the circuitry structure.

4. The substrate of claim 1, wherein an included angle between the arc-shaped surface of the circuitry structure and a bottom surface of the circuitry structure is less than an included angle between the arc-shaped surface of the circuitry structure and a top surface of the circuitry structure.

5. The substrate of claim 4, wherein the included angle between the arc-shaped surface of the circuitry structure and the bottom surface of the circuitry structure is an acute angle.

6. The substrate of claim 4, wherein the included angle between the arc-shaped surface of the circuitry structure and the top surface of the circuitry structure is an obtuse angle.

7. The substrate of claim 1, wherein the interconnection structure has an arc-shaped surface exposed in the recess portion, and an included angle between the arc-shaped surface of the circuitry structure and a bottom surface of the circuitry structure is less than an included angle between the arc-shaped surface of the interconnection structure and a top surface of the circuitry structure.

8. The substrate of claim 7, wherein the included angle between the arc-shaped surface of the circuitry structure and the bottom surface of the circuitry structure is an acute angle.

9. The substrate of claim 7, wherein the interconnection structure has an arc-shaped surface exposed in the recess portion, and the included angle between the arc-shaped surface of the interconnection structure and the top surface of the circuitry structure is an obtuse angle.

10. The substrate of claim 1, wherein a part of the recess portion is recessed from an outer side surface of the interconnection structure, the other part of the recess portion is recessed from an outer side surface of the circuitry structure, the interconnection structure has an arc-shaped surface exposed in the recess portion, and the recess portion is defined by the arc-shaped surface of the interconnection structure and the arc-shaped surface of the circuitry structure.

11. The substrate of claim 10, wherein the arc-shaped surface of the interconnection structure and the arc-shaped surface of the circuitry structure constitute a continuous arc-shaped surface.

12. The substrate of claim 1, wherein the capture land is embedded in the base material.

13. The substrate of claim 1, wherein a top surface of the capture land is substantially coplanar with a top surface of the base material.

14. The substrate of claim 1, wherein the interconnection structure has an arc-shaped surface exposed in the recess portion, and the arc-shaped surface of the circuitry structure is in a downward projection area of the arc-shaped surface of the interconnection structure.

15. The substrate of claim 1, wherein an outer side surface of the encapsulant is substantially coplanar with an outer side surface of the interconnection structure and an outer side surface of the capture land.

16. The substrate of claim 1, wherein the base material includes at least one first circuitry structure, the first circuitry structure includes at least one conductive trace, a first gap is between the conductive trace and the capture land, the circuitry structure has a portion corresponding to the first gap, a second gap is between the portion of the circuitry structure and a projection area of the capture land, and the second gap is less than the first gap.

17. A semiconductor package, comprising:
    a capture land;
    an interconnection structure contacting the capture land;
    a base material contacting the capture land and the interconnection structure;
    a circuitry structure contacting the base material and electrically connected to the capture land through the interconnection structure;
    a semiconductor chip disposed adjacent to the top surface of the base material; and
    an encapsulant disposed on the base material, and covering the semiconductor chip and the top surface of the capture land, wherein the interconnection structure and the circuitry structure jointly define a recess portion, the circuitry structure has an arc-shaped surface exposed in the recess portion, and the arc-shaped surface of the circuitry structure extends downward and outward.

18. The semiconductor package of claim 17, wherein the base material includes at least one dielectric structure and at least one first circuitry structure, and a portion of the dielectric structure is between the capture land and the first circuitry structure.

19. The semiconductor package of claim 18, wherein a top surface of the first circuitry structure is substantially coplanar with a bottom surface of the encapsulant.

20. The semiconductor package of claim 18, wherein the base material further includes a via structure electrically connected to the first circuitry structure, and a top surface of the via structure is between a top surface of the dielectric structure and a bottom surface of the dielectric structure.

* * * * *